(12) United States Patent
Tanaka et al.

(10) Patent No.: US 11,121,008 B2
(45) Date of Patent: Sep. 14, 2021

(54) METHOD OF PROCESSING SUBSTRATE AND SUBSTRATE PROCESSING APPARATUS

(71) Applicant: SCREEN Holdings Co., Ltd., Kyoto (JP)

(72) Inventors: Takayoshi Tanaka, Kyoto (JP); Akira Oato, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 151 days.

(21) Appl. No.: 16/118,473

(22) Filed: Aug. 31, 2018

(65) Prior Publication Data

US 2019/0088511 A1 Mar. 21, 2019

(30) Foreign Application Priority Data

Sep. 21, 2017 (JP) .............................. JP2017-181323

(51) Int. Cl.
*H01L 21/02* (2006.01)
*H01L 21/67* (2006.01)
*H01L 21/306* (2006.01)

(52) U.S. Cl.
CPC .. *H01L 21/67051* (2013.01); *H01L 21/02057* (2013.01); *H01L 21/306* (2013.01); *H01L 21/67028* (2013.01)

(58) Field of Classification Search
CPC ......... H01L 21/67051; H01L 21/02057; H01L 21/306; H01L 21/67028
See application file for complete search history.

(56) References Cited

U.S. PATENT DOCUMENTS

| | | | |
|---|---|---|---|
| 8,821,974 B2 | 9/2014 | Kimura et al. |
| 8,956,465 B2 | 2/2015 | Nonaka |
| 9,005,703 B2 | 4/2015 | Kimura et al. |
| 9,455,134 B2 | 9/2016 | Kimura et al. |
| 10,121,648 B2 | 11/2018 | Kimura |
| 2008/0142054 A1 | 6/2008 | Eitoku |
| 2008/0190454 A1 | 8/2008 | Eitoku |
| 2009/0311874 A1 | 12/2009 | Tomita et al. |

(Continued)

FOREIGN PATENT DOCUMENTS

| | | |
|---|---|---|
| CN | 102376540 | 3/2012 |
| CN | 102909156 | 2/2013 |

(Continued)

*Primary Examiner* — Sharidan Carrillo
(74) *Attorney, Agent, or Firm* — JCIPRNET

(57) ABSTRACT

A liquid of a hydrophobizing agent is supplied to a surface of a substrate to form a liquid film of the hydrophobizing agent that covers an entire surface region of the substrate. Thereafter, a liquid amount of the hydrophobizing agent on the substrate is decreased while maintaining a state in which the entire surface region of the substrate is covered with the liquid film of the hydrophobizing agent. Thereafter, the liquid of the hydrophobizing agent on the substrate is replaced with a liquid of the first organic solvent by supplying the liquid of the first organic solvent to the surface of the substrate covered with the liquid film of the hydrophobizing agent in a state in which the liquid amount of the hydrophobizing agent on the substrate has decreased. Thereafter, the substrate is dried.

9 Claims, 8 Drawing Sheets

(56) References Cited

U.S. PATENT DOCUMENTS

| | | | | |
|---|---|---|---|---|
| 2014/0065295 | A1* | 3/2014 | Emoto | B05D 5/08 |
| | | | | 427/8 |
| 2015/0034130 | A1* | 2/2015 | Koide | H01L 21/67051 |
| | | | | 134/26 |
| 2016/0293400 | A1* | 10/2016 | Kimura | H01L 21/02057 |
| 2017/0117164 | A1* | 4/2017 | Kikuchi | H01L 21/02052 |
| 2017/0236729 | A1* | 8/2017 | Kawabuchi | H01L 21/67051 |
| | | | | 134/10 |
| 2018/0345315 | A1* | 12/2018 | Tanaka | H01L 21/6715 |
| 2019/0088469 | A1* | 3/2019 | Tanaka | H01L 21/02057 |
| 2019/0088511 | A1* | 3/2019 | Tanaka | H01L 21/02057 |

FOREIGN PATENT DOCUMENTS

| | | |
|---|---|---|
| CN | 107086172 | 8/2017 |
| JP | 2008153452 | 7/2008 |
| JP | 2008198741 | 8/2008 |
| JP | 2010050143 | 3/2010 |
| JP | 2010129809 | 6/2010 |
| JP | 2016072489 | 5/2016 |
| KR | 20140029095 | 3/2014 |
| KR | 20150105589 | 9/2015 |
| RU | 1582548 | 8/1994 |
| TW | 201351493 | 12/2013 |

\* cited by examiner

METHOD OF PROCESSING SUBSTRATE AND SUBSTRATE PROCESSING APPARATUS

CROSS REFERENCE TO RELATED APPLICATIONS

This application claims the priority benefit of Japanese Patent Application No. 2017-181323, filed on Sep. 21, 2017. The entirety of the above-mentioned patent application is hereby incorporated by reference herein and made a part of this specification.

BACKGROUND

Technical Field

This disclosure relates to a method of processing a substrate and a substrate processing apparatus for processing the substrate. Examples of the substrate to be processed include semiconductor wafers, substrates for a liquid crystal display, substrates for an optical disc, substrates for a magnetic disk, substrates for a magneto-optical disks, substrates for a photomask, ceramic substrates, substrates for a solar cell, substrates for a flat panel display (FPD) such as an organic electroluminescence (organic EL) display, and the like.

Description of Related Art

In a manufacturing process of semiconductor devices, liquid crystal displays, or the like, substrate processing apparatuses for processing substrates such as semiconductor wafers or glass substrates for liquid crystal displays are used. In each of the embodiments of US 2009/0311874 A1, a water repellent protective film formed on a surface of a substrate for preventing collapse of a pattern is disclosed.

For example, in a second embodiment of US 2009/0311874A1, processing of a substrate using a single-wafer-processing type substrate processing apparatus is disclosed. In this processing, chemical liquids such as sulfuric peroxide mixture (SPM), pure water, an alcohol such as isopropyl alcohol (IPA), a silane coupling agent, an alcohol such as IPA, and pure water are supplied to the substrate in that order. Thereafter, a spin dry processing for drying the substrate by shaking off pure water remaining on the surface of the substrate is performed. After the substrate is dried, the water repellent protective film formed on the surface of the substrate by supplying the silane coupling agent is removed from the substrate by ashing processing such as dry ashing or ozone gas processing.

According to the research of the present inventors, as in the second embodiment of US 2009/0311874A1, it was found that there was a large increase in the number of extremely small particles in the processing of supplying a hydrophobizing agent such as a silane coupling agent to the substrate and then replacing the hydrophobizing agent on the substrate with an alcohol such as IPA. When greater cleanliness is required, even these small particles cannot be ignored.

SUMMARY

One embodiment of the disclosure provides a method of processing a substrate including a hydrophobizing agent supply step of forming a liquid film of a hydrophobizing agent that covers an entire surface region of a substrate by supplying a liquid which is the hydrophobizing agent for hydrophobizing a surface of the substrate with a pattern formed thereon to the surface of the substrate, a liquid amount decreasing step of decreasing a liquid amount of the hydrophobizing agent on the substrate while maintaining a state in which the entire surface region of the substrate is covered with the liquid film of the hydrophobizing agent after the hydrophobizing agent supply step, a first organic solvent supply step of supplying a liquid which is a first organic solvent to the surface of the substrate covered with the liquid film of the hydrophobizing agent in a state in which the liquid amount of the hydrophobizing agent on the substrate has decreased after the liquid amount decreasing step so that the liquid of the hydrophobizing agent on the substrate is replaced with the liquid which is the first organic solvent, and a drying step of drying the substrate after the first organic solvent supply step.

Another embodiment of the disclosure provides a substrate processing apparatus including a substrate holding unit configured to horizontally hold a substrate with a pattern formed on a surface thereof, a hydrophobizing agent supply unit configured to supply a liquid of a hydrophobizing agent for hydrophobizing the surface of the substrate to the surface of the substrate held by the substrate holding unit, a liquid amount decreasing unit configured to decrease a liquid amount of the hydrophobizing agent on the substrate held by the substrate holding unit, a first organic solvent supply unit configured to supply a liquid of a first organic solvent to the substrate held by the substrate holding unit, a drying unit configured to dry the substrate held by the substrate holding unit, and a controller configured to control the hydrophobizing agent supply unit, the liquid amount decreasing unit, the first organic solvent supply unit, and the drying unit.

The controller executes a hydrophobizing agent supply step of supplying the liquid of the hydrophobizing agent for hydrophobizing the surface of the substrate to the surface of the substrate so that a liquid film of the hydrophobizing agent that covers the entire surface region of the substrate is formed, a liquid amount decreasing step of decreasing the liquid amount of the hydrophobizing agent on the surface while maintaining a state in which an entire surface region of the substrate is covered with the liquid film of the hydrophobizing agent after the hydrophobizing agent supply step, a first organic solvent supply step of supplying a liquid of a first organic solvent to the surface of the substrate covered with the liquid film of the hydrophobizing agent in a state in which the liquid amount of the hydrophobizing agent on the substrate has decreased after the liquid amount decreasing step so that the liquid of the hydrophobizing agent on the substrate is replaced with the liquid of the first organic solvent, and a drying step of drying the substrate after the first organic solvent supply step. According to this configuration, the same effects as the above-described effects can be achieved.

The foregoing and other aspects, features and effects of the disclosure will become apparent from the following description of embodiments with reference to the accompanying drawings.

DESCRIPTION OF THE EMBODIMENTS

In the following description, isopropyl alcohol (IPA), a hydrophobizing agent, and a hydrofluoroolefin (HFO) represent a liquid, unless otherwise specified.

Figure 1:
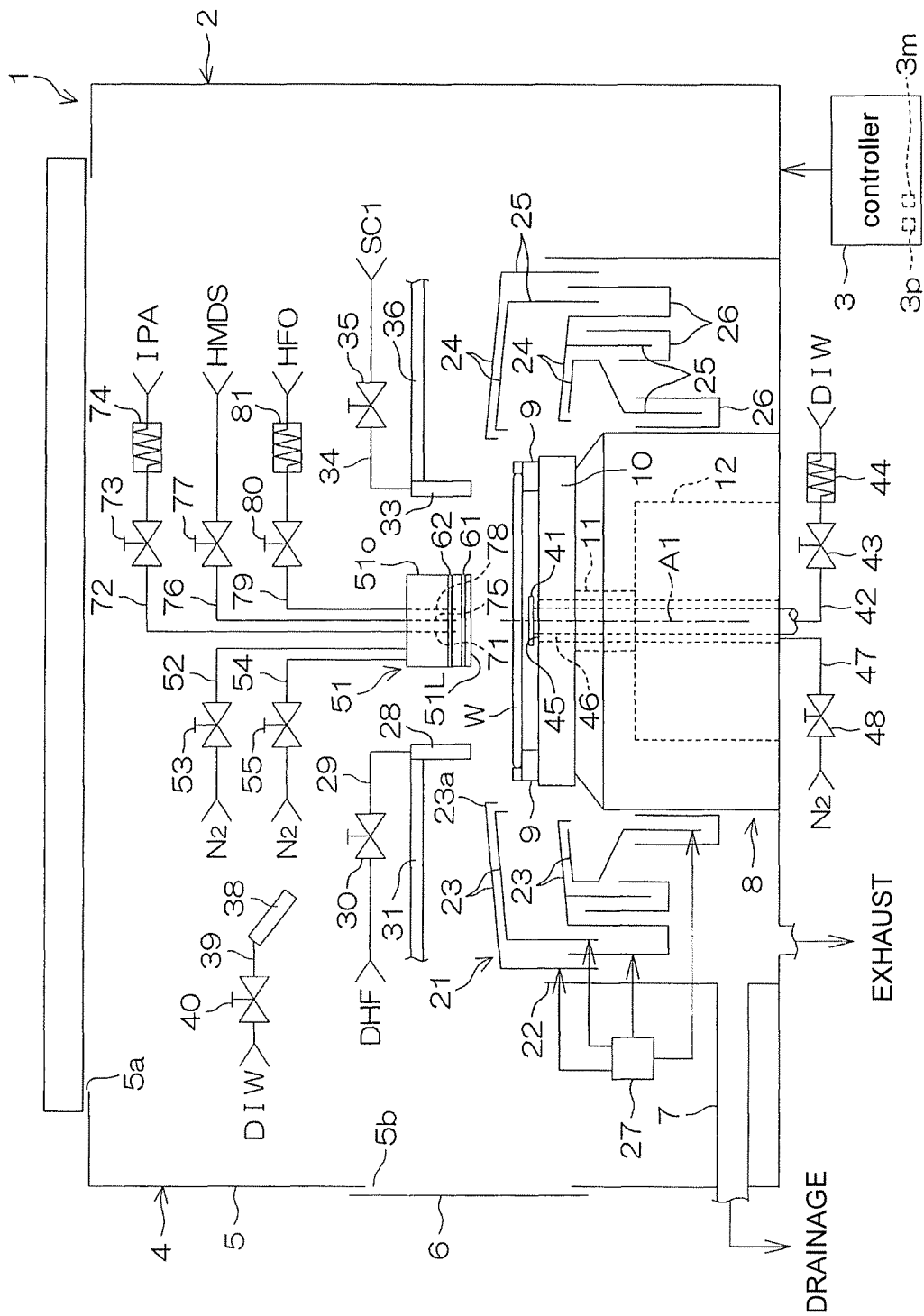
FIG. 1 is a schematic view of the inside of a processing unit provided in a substrate processing apparatus according to one embodiment of the disclosure when viewed horizontally.
Figure 2:
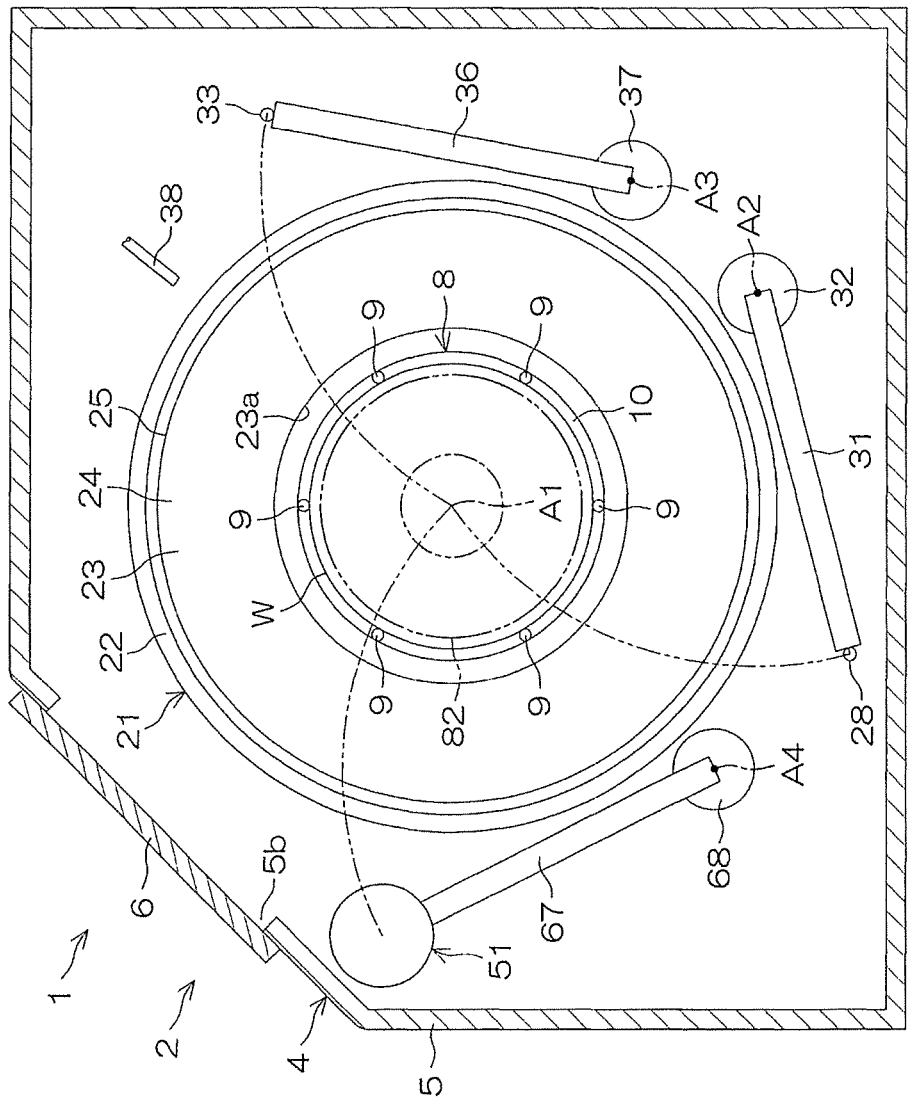
FIG. 2 is a schematic view of a spin chuck and a processing cup when viewed from above.
Figure 3A:
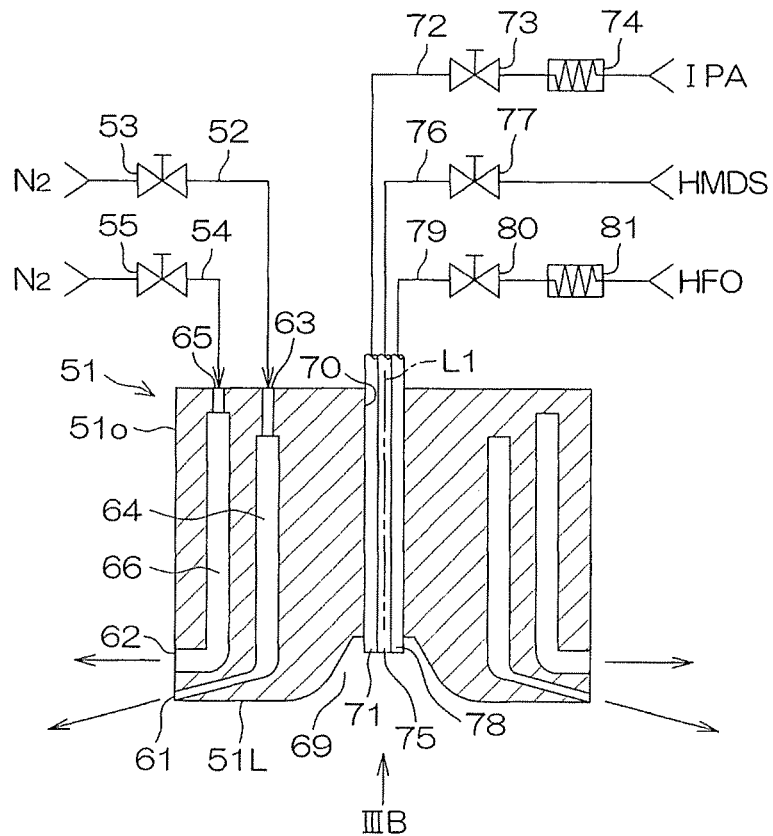
FIG. 3A is a schematic view illustrating a vertical cross section of a gas nozzle.
Figure 3B:
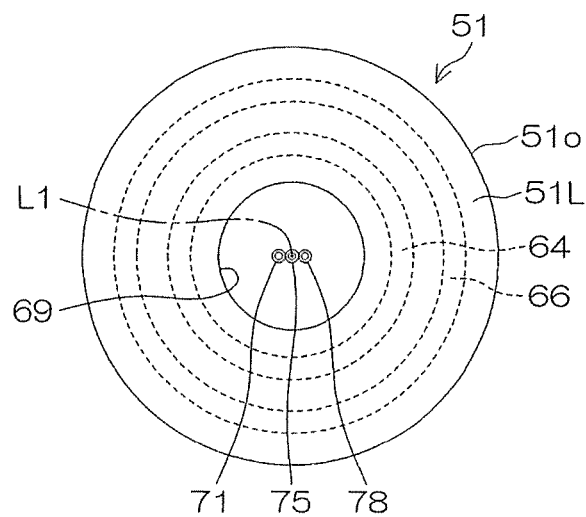
FIG. 3B is a schematic view of the gas nozzle when viewed in a direction indicated by an arrow IIIB illustrated in FIG. 3A, illustrating a bottom surface of the gas nozzle.

FIG. 1 is a schematic view of the inside of a processing unit 2 provided in a substrate processing apparatus 1 according to one embodiment of the disclosure when viewed horizontally. FIG. 2 is a schematic view of a spin chuck 8 and a processing cup 21 when viewed from above. FIGS. 3A and 3B are schematic views illustrating a gas nozzle 51. FIG. 3A is a schematic view illustrating a vertical cross section of the gas nozzle 51, and FIG. 3B is a schematic view of the gas nozzle 51 when viewed in a direction indicated by an arrow IIIB illustrated in FIG. 3A, illustrating a bottom surface of the gas nozzle 51.

As illustrated in FIG. 1, the substrate processing apparatus 1 is a single-wafer-processing type apparatus which processes disc-shaped substrates W such as semiconductor wafers one at a time. The substrate processing apparatus 1 includes a load port (not illustrated) on which a box type carrier accommodating the substrate W is placed, the processing unit 2 for processing the substrates W transferred from the carrier on the load port with a processing fluid such as a processing liquid or a processing gas, a transfer robot (not illustrated) for transferring the substrate W between the load port and the processing unit 2, and a controller 3 for controlling the substrate processing apparatus 1.

The processing unit 2 includes a box-shaped chamber 4 having an internal space, a spin chuck 8 for rotating the substrate W around a vertical rotation axis A1 passing through a central portion of the substrate W while holding the substrate W horizontally in the chamber 4, and the cylindrical processing cup 21 for receiving the processing liquid discharged outward from the substrate W and the spin chuck 8.

The chamber 4 includes a box-shaped partition wall 5 having a loading/unloading port 5b through which the substrate W passes, and a shutter 6 for opening and closing the loading/unloading port 5b. Clean air, which is air filtered through a filter, is constantly supplied into the chamber 4 from a blower port 5a provided in an upper portion of the partition wall 5. Gases in the chamber 4 are discharged from the chamber 4 through an exhaust duct 7 connected to a bottom portion of the processing cup 21. Thereby, a constant downflow of the clean air is formed in the chamber 4.

The spin chuck 8 includes a disc-shaped spin base 10 held in a horizontal posture, a plurality of chuck pins 9 holding the substrate W in a horizontal posture above the spin base 10, a spin shaft 11 extending downward from a central portion of the spin base 10, and a spin motor 12 rotating the spin base 10 and the plurality of chuck pins 9 by rotating the spin shaft 11. The spin chuck 8 is not limited to a clamping type chuck by which the plurality of chuck pins 9 are brought into contact with an outer circumferential surface of the substrate W, and may be a vacuum type chuck by which a rear surface (lower surface) of the substrate W, which is a non-device forming surface, is adsorbed to an upper surface of the spin base 10 so that the substrate W is horizontally held.

The processing cup 21 includes a plurality of guards 23 receiving a liquid discharged outward from the substrate W, a plurality of cups 26 receiving the liquid guided downward by the guard 23, and a cylindrical outer wall member 22 surrounding the plurality of guards 23 and the plurality of cups 26. FIG. 1 illustrates an example in which four guards 23 and three cups 26 are provided.

Each of the guards 23 includes a cylindrical tubular portion 25 surrounding the spin chuck 8, and an annular ceiling portion 24 extending obliquely upward from an upper end portion of the tubular portion 25 toward the rotation axis A1. A plurality of ceiling portions 24 overlap in a vertical direction, and a plurality of tubular portions 25 are concentrically disposed. The plurality of cups 26 are respectively disposed below the plurality of tubular portions 25. The cups 26 form upwardly open annular liquid receiving grooves.

The processing unit 2 includes a guard lifting unit 27 that raises and lowers the plurality of guards 23 individually. The guard lifting unit 27 raises and lowers the guards 23 vertically between an upper position and a lower position. The upper position is a position at which an upper end 23a of the guard 23 is positioned above a holding position at which the substrate W held by the spin chuck 8 is disposed. The lower position is a position at which the upper end 23a of the guard 23 is positioned below the holding position. An annular upper end of the ceiling portion 24 corresponds to the upper end 23a of the guard 23. As illustrated in FIG. 2, the upper end 23a of the guard 23 surrounds the substrate W and the spin base 10 in a plan view.

When a processing liquid is supplied to the substrate W in a state in which the spin chuck 8 is rotating the substrate W, the processing liquid supplied to the substrate W is shaken off around the substrate W. When the processing liquid is supplied to the substrate W, the upper end 23a of at least one of the guards 23 is disposed above the substrate W. Therefore, the processing liquid such as a chemical liquid or a rinsing liquid discharged around the substrate W is received by any one of the guards 23, and is guided to the cup 26 corresponding to the guard 23.

As illustrated in FIG. 1, the processing unit 2 includes a first chemical liquid nozzle 28 discharging a chemical liquid downward toward an upper surface of the substrate W. The first chemical liquid nozzle 28 is connected to a first chemical liquid pipe 29 that guides the chemical liquid to the first chemical liquid nozzle 28. When a first chemical liquid valve 30 incorporated into the first chemical liquid pipe 29 is opened, the chemical liquid is continuously discharged downward from a discharge port of the first chemical liquid nozzle 28. The chemical liquid discharged from the first chemical liquid nozzle 28 may be, for example, dilute hydrofluoric acid (DHF). DHF is a solution obtained by diluting hydrofluoric acid (hydrofluoric acid) with water. The chemical liquid may be something other than DHF.

Although not illustrated, the first chemical liquid valve 30 includes a valve body forming a flow path, a valve element disposed in the flow path, and an actuator moving the valve element. The same applies to other valves. The actuator may be a pneumatic actuator or an electric actuator, or may be an actuator other than these. The controller 3 opens and closes the first chemical liquid valve 30 by controlling the actuator. When the actuator is an electric actuator, the controller 3 positions the valve element at an arbitrary position between a fully closed position and a fully open position by controlling the electric actuator.

As illustrated in FIG. 2, the processing unit 2 includes a first nozzle arm 31 that holds the first chemical liquid nozzle 28, and a first nozzle moving unit 32 that moves the first chemical liquid nozzle 28 in at least one of the vertical direction and the horizontal direction by moving the first nozzle arm 31. The first nozzle moving unit 32 moves the first chemical liquid nozzle 28 horizontally between a processing position at which a processing liquid discharged from the first chemical liquid nozzle 28 is applied on the upper surface of the substrate W and a standby position (a position illustrated in FIG. 2) at which the first chemical liquid nozzle 28 is positioned around the spin chuck 8 in a plan view. The first nozzle moving unit 32 may be, for example, a turning unit that moves the first chemical liquid nozzle 28 horizontally around a nozzle rotation axis A2 extending vertically around the spin chuck 8 and the processing cup 21.

As illustrated in FIG. 1, the processing unit 2 includes a second chemical liquid nozzle 33 that discharges a chemical liquid downward toward the upper surface of the substrate W. The second chemical liquid nozzle 33 is connected to a second chemical liquid pipe 34 that guides the chemical liquid to the second chemical liquid nozzle 33. When a second chemical liquid valve 35 incorporated into the second chemical liquid pipe 34 is opened, the chemical liquid is continuously discharged downward from a discharge port of the second chemical liquid nozzle 33. The chemical liquid discharged from the second chemical liquid nozzle 33 may be, for example, SC1 (a mixed liquid of ammonia water, hydrogen peroxide water, and water). The chemical liquid may be something other than SC1.

As illustrated in FIG. 2, the processing unit 2 includes a second nozzle arm 36 that holds the second chemical liquid nozzle 33, and a second nozzle moving unit 37 that moves the second chemical liquid nozzle 33 in at least one of the vertical direction and the horizontal direction by moving the second nozzle arm 36. The second nozzle moving unit 37 horizontally moves the second chemical liquid nozzle 33 between a processing position at which a processing liquid discharged from the second chemical liquid nozzle 33 is applied on the upper surface of the substrate W and a standby position (a position illustrated in FIG. 2) at which the second chemical liquid nozzle 33 is positioned around the spin chuck 8 in a plan view. The second nozzle moving unit 37 may be, for example, a turning unit that moves the second chemical liquid nozzle 33 horizontally around a nozzle rotation axis A3 extending vertically around the spin chuck 8 and the processing cup 21.

The processing unit 2 includes a rinsing liquid nozzle 38 that discharges a rinsing liquid downward toward the upper surface of the substrate W. The rinsing liquid nozzle 38 is fixed to the partition wall 5 of the chamber 4. The rinsing liquid discharged from the rinsing liquid nozzle 38 is applied on a central portion of the upper surface of the substrate W. As illustrated in FIG. 1, the rinsing liquid nozzle 38 is connected to a rinsing liquid pipe 39 that guides the rinsing liquid to the rinsing liquid nozzle 38. When a rinsing liquid valve 40 incorporated into the rinsing liquid pipe 39 is opened, the rinsing liquid is continuously discharged downward from a discharge port of the rinsing liquid nozzle 38. The rinsing liquid discharged from the rinsing liquid nozzle 38 may be, for example, pure water (deionized water). The rinsing liquid may be any one of carbonated water, electrolyzed ionic water, hydrogen water, ozone water, and hydrochloric acid water at a diluted concentration (for example, about 10 ppm to 100 ppm).

The processing unit 2 includes a lower surface nozzle 41 that discharges a processing liquid upward toward a central portion of a lower surface of the substrate W. The lower surface nozzle 41 is inserted into a through hole which is open on a central portion of the upper surface of the spin base 10. A discharge port of the lower surface nozzle 41 is disposed above the upper surface of the spin base 10, and vertically faces the central portion of the lower surface of the substrate W. The lower surface nozzle 41 is connected to a lower side rinsing liquid pipe 42 in which a lower side rinsing liquid valve 43 is incorporated. The rinsing liquid heater 44 that heats a rinsing liquid supplied to the lower surface nozzle 41 is incorporated into the lower side rinsing liquid pipe 42.

When the lower side rinsing liquid valve 43 is opened, the rinsing liquid is supplied from the lower side rinsing liquid pipe 42 to the lower surface nozzle 41 and is continuously discharged upward from the discharge port of the lower surface nozzle 41. The lower surface nozzle 41 discharges the rinsing liquid heated to a temperature higher than room temperature (20° C. to 30° C.) and lower than a boiling point of the rinsing liquid by the rinsing liquid heater 44. The rinsing liquid discharged from the lower surface nozzle 41 may be, for example, pure water. The rinsing liquid discharged from the lower surface nozzle 41 may be a rinsing liquid other than the above-described pure water. The lower surface nozzle 41 is fixed to the partition wall 5 of the chamber 4. Even when the spin chuck 8 rotates the substrate W, the lower surface nozzle 41 does not rotate.

The substrate processing apparatus 1 includes a lower side gas pipe 47 which guides a gas from a gas supply source to a lower side central opening 45 which is open on the central portion of the upper surface of the spin base 10, and a lower side gas valve 48 incorporated into the lower side gas pipe 47. When the lower side gas valve 48 is opened, a gas supplied from the lower side gas pipe 47 flows upward through a cylindrical lower side gas flow path 46 formed by an outer circumferential surface of the lower surface nozzle 41 and an inner circumferential surface of the spin base 10, and is discharged upward from the lower side central opening 45. The gas supplied to the lower side central opening 45 may be, for example, nitrogen gas. The gas may be another inert gas such as helium gas or argon gas, or may be clean air or dry air (dehumidified clean air).

The processing unit 2 includes the gas nozzle 51 that forms an airflow for protecting the upper surface of the substrate W held by the spin chuck 8. An outer diameter of the gas nozzle 51 is smaller than a diameter of the substrate W. The gas nozzle 51 includes one or more gas discharge ports for radially discharging a gas above the substrate W. FIG. 1 illustrates an example in which two gas discharge ports (a first gas discharge port 61 and a second gas discharge port 62) are provided in the gas nozzle 51.

The first gas discharge port 61 and the second gas discharge port 62 are open on an outer circumferential surface 51o of the gas nozzle 51. The first gas discharge port 61 and the second gas discharge port 62 are annular slits continuous in a circumferential direction over an entire circumference of the gas nozzle 51. The first gas discharge port 61 and the second gas discharge port 62 are disposed above a lower surface 51L of the gas nozzle 51. The second gas discharge port 62 is disposed above the first gas discharge port 61. Diameters of the first gas discharge port 61 and the second gas discharge port 62 are smaller than an outer diameter of the substrate W. The diameters of the first gas discharge port 61 and the second gas discharge port 62 may be equal to each other or may be different from each other.

The first gas discharge port 61 is connected to a first gas pipe 52 in which a first gas valve 53 is incorporated. The second gas discharge port 62 is connected to a second gas pipe 54 in which a second gas valve 55 is incorporated. When the first gas valve 53 is opened, a gas is supplied from the first gas pipe 52 to the first gas discharge port 61 to be discharged from the first gas discharge port 61. Similarly, when the second gas valve 55 is opened, a gas is supplied from the second gas pipe 54 to the second gas discharge port 62 to be discharged from the second gas discharge port 62. The gas supplied to the first gas discharge port 61 and the second gas discharge port 62 is nitrogen gas. An inert gas other than nitrogen gas or another gas such as clean air or dry air may be supplied to the first gas discharge port 61 and the second gas discharge port 62.

As illustrated in FIG. 3A, the gas nozzle 51 includes a first inlet port 63 which is open on a surface of the gas nozzle 51, and a first gas path 64 which guides a gas from the first inlet port 63 to the first gas discharge port 61. The gas nozzle 51 further includes a second inlet port 65 which is open on the surface of the gas nozzle 51, and a second gas path 66 which guides a gas from the second inlet port 65 to the second gas discharge port 62. A gas flowing in the first gas pipe 52 flows into the first gas path 64 through the first inlet port 63 and is guided to the first gas discharge port 61 by the first gas path 64. Similarly, a gas flowing in the second gas pipe 54 flows into the second gas path 66 through the second inlet port 65 and is guided to the second gas discharge port 62 by the second gas path 66.

The first inlet port 63 and the second inlet port 65 are disposed above the first gas discharge port 61 and the second gas discharge port 62. The first gas path 64 extends from the first inlet port 63 to the first gas discharge port 61, and the second gas path 66 extends from the second inlet port 65 to the second gas discharge port 62. As illustrated in FIG. 3B, the first gas path 64 and the second gas path 66 are cylindrically shaped to surround a vertical central line L1 of the gas nozzle 51. The first gas path 64 and the second gas path 66 are concentrically disposed. The first gas path 64 is surrounded by the second gas path 66.

As illustrated in FIG. 3A, when the first gas discharge port 61 discharges a gas, an annular airflow radially spreading from the first gas discharge port 61 is formed. Similarly, when the second gas discharge port 62 discharges a gas, an annular airflow radially spreading from the second gas discharge port 62 is formed. Most of the gas discharged from the first gas discharge port 61 passes under the gas discharged from the second gas discharge port 62. Therefore, when both the first gas valve 53 and the second gas valve 55 are opened, a plurality of annular airflows overlapped vertically are formed around the gas nozzle 51.

FIG. 3A illustrates an example in which the first gas discharge port 61 radially discharges a gas obliquely downward and the second gas discharge port 62 radially discharges a gas in a horizontal direction. The first gas discharge port 61 may discharge the gas radially in the horizontal direction. The second gas discharge port 62 may radially discharge the gas obliquely downward. A direction in which the first gas discharge port 61 discharges a gas and a direction in which the second gas discharge port 62 discharges a gas may be parallel to each other.

As illustrated in FIG. 2, the processing unit 2 includes a third nozzle arm 67 that holds the gas nozzle 51, and a third nozzle moving unit 68 that moves the gas nozzle 51 in the vertical direction and the horizontal direction by moving the third nozzle arm 67. The third nozzle moving unit 68 may be, for example, a turning unit that moves the gas nozzle 51 horizontally around a nozzle rotation axis A4 extending vertically around the spin chuck 8 and the processing cup 21.

The third nozzle moving unit 68 moves the gas nozzle 51 horizontally between a central upper position (a position illustrated in FIG. 1) and a standby position (a position indicated by a solid line in FIG. 2). The third nozzle moving unit 68 further moves the gas nozzle 51 vertically between the central upper position and a central lower position (see FIG. 5B). The standby position is a position at which the gas nozzle 51 is positioned around the processing cup 21 in a plan view. The central upper position and the central lower position are a position (a position indicated by two-dot chain line in FIG. 2) at which the gas nozzle 51 overlaps the central portion of the substrate W in a plan view. The central upper position is a position above the central lower position. When the third nozzle moving unit 68 lowers the gas nozzle 51 from the central upper position to the central lower position, the lower surface 51L of the gas nozzle 51 approaches the upper surface of the substrate W.

In the following description, the central upper position and the central lower position may be collectively referred to as a central position in some cases. When the gas nozzle 51 is disposed at the central position, the gas nozzle 51 overlaps the central portion of the upper surface of the substrate W in a plan view. At this time, the lower surface 51L of the gas nozzle 51 faces and is parallel to the central portion of the upper surface of the substrate W. However, since the gas nozzle 51 is smaller than the substrate W in a plan view, each portion of the upper surface of the substrate W other than the central portion is exposed without overlapping the gas nozzle 51 in a plan view. When at least one of the first gas valve 53 and the second gas valve 55 is open while the gas nozzle 51 is disposed at the central position, the annular airflow radially spreading from the gas nozzle 51 flows above each portion of the upper surface of the substrate W other than the central portion. Thereby, the entire upper surface region of the substrate W is protected by the gas nozzle 51 and the airflow.

As illustrated in FIG. 3A, the processing unit 2 includes an alcohol nozzle 71 that discharges IPA downward toward the upper surface of the substrate W, a hydrophobizing agent nozzle 75 that discharges a hydrophobizing agent downward toward the upper surface of the substrate W, and a solvent nozzle 78 that discharges HFO downward toward the upper surface of the substrate W. The alcohol nozzle 71, the hydrophobizing agent nozzle 75, and the solvent nozzle 78 are inserted into an insertion hole 70 extending upward from the lower surface 51L of the gas nozzle 51, and are held by the gas nozzle 51. When the third nozzle moving unit 68 moves the gas nozzle 51, the alcohol nozzle 71, the hydrophobizing agent nozzle 75, and the solvent nozzle 78 also move along with the gas nozzle 51.

Discharge ports of the alcohol nozzle 71, the hydrophobizing agent nozzle 75, and the solvent nozzle 78 are disposed above the lower surface 51L of the gas nozzle 51. As illustrated in FIG. 3B, when the gas nozzle 51 is viewed from below, the discharge ports of the alcohol nozzle 71, the hydrophobizing agent nozzle 75, and the solvent nozzle 78 are exposed at an upper side central opening 69 which is open at the lower surface 51L of the gas nozzle 51. A liquid discharged from the alcohol nozzle 71, the hydrophobizing agent nozzle 75, and the solvent nozzle 78 passes downward through the upper side central opening 69 of the gas nozzle 51.

The alcohol nozzle 71 is connected to an alcohol pipe 72 in which an alcohol valve 73 is incorporated. The hydrophobizing agent nozzle 75 is connected to a hydrophobizing agent pipe 76 in which a hydrophobizing agent valve 77 is incorporated. The solvent nozzle 78 is connected to a solvent pipe 79 in which a solvent valve 80 is incorporated. A first heater 74 for heating the IPA supplied to the alcohol nozzle 71 is incorporated into the alcohol pipe 72. A second heater 81 for heating the HFO supplied to the solvent nozzle 78 is incorporated into the solvent pipe 79. A flow rate regulating valve that changes a flow rate of the hydrophobizing agent supplied to the hydrophobizing agent nozzle 75 may be incorporated into the hydrophobizing agent pipe 76.

When the alcohol valve 73 is opened, the IPA is supplied from the alcohol pipe 72 to the alcohol nozzle 71 to be continuously discharged downward from the discharge port of the alcohol nozzle 71. Similarly, when the hydrophobizing agent valve 77 is opened, the hydrophobizing agent is supplied from the hydrophobizing agent pipe 76 to the hydrophobizing agent nozzle 75 to be continuously discharged downward from the discharge port of the hydrophobizing agent nozzle 75. When the solvent valve 80 is opened, the HFO is supplied from the solvent pipe 79 to the solvent nozzle 78 to be continuously discharged downward from the discharge port of the solvent nozzle 78.

IPA and HFO are compounds having a lower surface tension than water. The surface tension decreases in accordance with temperature increase. When temperatures thereof are the same, the surface tension of HFO is lower than the surface tension of IPA. The alcohol nozzle 71 discharges IPA heated to a temperature higher than room temperature and lower than a boiling point of the IPA by the first heater 74. Similarly, the solvent nozzle 78 discharges HFO heated to a temperature higher than room temperature and lower than a boiling point of the HFO by the second heater 81.

Temperatures of the IPA and the HFO are set so that the surface tension of the HFO when discharged from the solvent nozzle 78 is lower than the surface tension of the IPA when discharged from the alcohol nozzle 71. The IPA discharged from the alcohol nozzle 71 may be adjusted to, for example, 70° C. by the first heater 74. The HFO discharged from the solvent nozzle 78 may be adjusted to, for example, 50° C. by the second heater 81. When it is below a boiling point of the HFO, a temperature of the HFO may be equal to or higher than a temperature of the IPA.

IPA is alcohol having a lower surface tension than water and having a lower boiling point than water. If a surface tension is lower than that of water, alcohol other than IPA may be supplied to the alcohol nozzle 71. HFO is a fluorine-based organic solvent having a lower surface tension than IPA and a lower boiling point than water. If a surface tension is lower than that of IPA, a fluorine-based organic solvent other than HFO may be supplied to the solvent nozzle 78. Such fluorine-based organic solvents include hydrofluoroether (HFE). Alcohols such as IPA contain a hydroxyl group which is a hydrophilic group. IPA has higher hydrophilicity with respect to water than fluorine-based organic solvents such as HFO.

A hydrophobizing agent is a silylation agent that renders the surface of the substrate W including a surface of a pattern hydrophobic. The hydrophobizing agent includes at least one of hexamethyldisilazane (HMDS), tetramethylsilane (TMS), a fluorine-based alkylchlorosilane, an alkyldisilazane, and a non-chlorinated hydrophobizing agent. Non-chlorinated hydrophobizing agents may include, for example, at least one of dimethylsilyldimethylamine, dimethylsilyldiethylamine, hexamethyldisilazane, tetramethyldisilazane, bis(dimethylamino)dimethylsilane, N,N-dimethylaminotrimethylsilane, N-(trimethylsilyl)dimethylamine, and organosilane compounds.

In FIG. 1 and the like, an example in which the hydrophobizing agent is HMDS is illustrated. A liquid supplied to the hydrophobizing agent nozzle 75 may be a liquid in which a proportion of the hydrophobizing agent is 100% or substantially 100%, or may be a diluted solution obtained by diluting the hydrophobizing agent with a solvent. Such solvents include, for example, propylene glycol monomethyl ether acetate (PGMEA). Alcohols such as IPA contains a methyl group. Similarly, the hydrophobizing agent such as HMDS contains a methyl group. Therefore, IPA is miscible with a hydrophobizing agent such as HMDS.

Next, an example of processing of the substrate W performed by the substrate processing apparatus 1 will be described.

Figure 4:
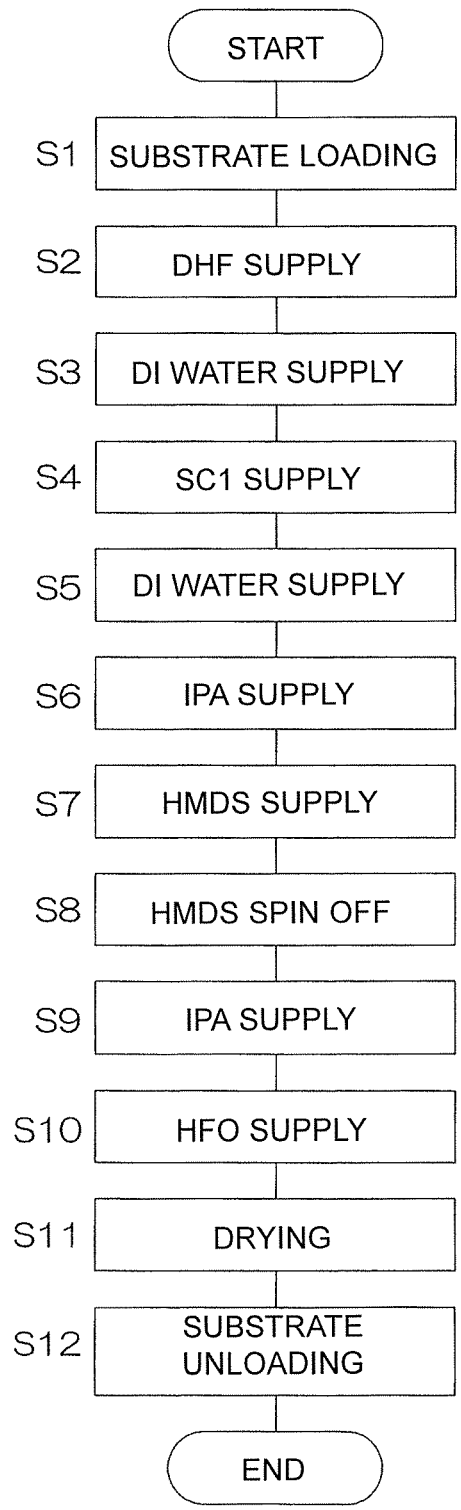
FIG. 4 is a process flow diagram for describing an example of processing of a substrate performed by the substrate processing apparatus.

FIG. 4 is a process flow diagram for describing an example of processing of the substrate W performed by the substrate processing apparatus 1. FIGS. 5A to 5D are schematic cross-sectional views illustrating a state of the substrate W when an example of the processing of the substrate W shown in FIG. 4 is being performed. FIG. 6 is a time chart showing an operation of the substrate processing apparatus 1 when an example of the processing of the substrate W shown in FIG. 4 is being performed. In FIG. 6, ON of IPA means that IPA is being discharged toward the substrate W, and OFF of IPA means that the discharge of the IPA is stopped. The same applies to other processing liquids such as a hydrophobizing agent.

Figure 5A:
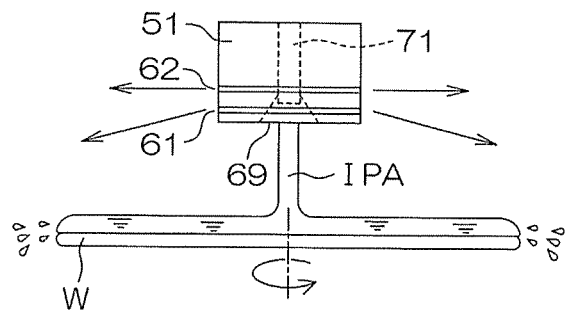
FIG. 5A is a schematic cross-sectional view illustrating a state of the substrate when a first alcohol supply step is performed.
Figure 5B:
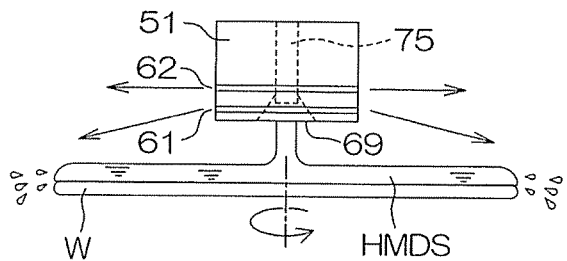
FIG. 5B is a schematic cross-sectional view illustrating a state of the substrate when a hydrophobizing agent supply step is performed.
Figure 5C:
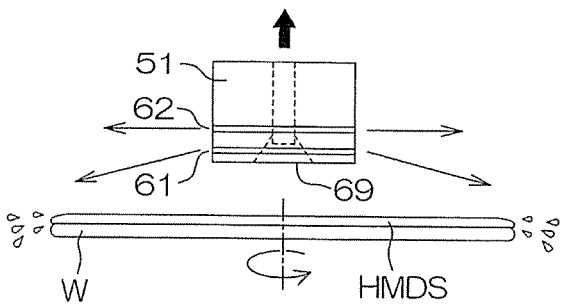
FIG. 5C is a schematic cross-sectional view illustrating a state of the substrate when a liquid amount decreasing step is performed.
Figure 5D:
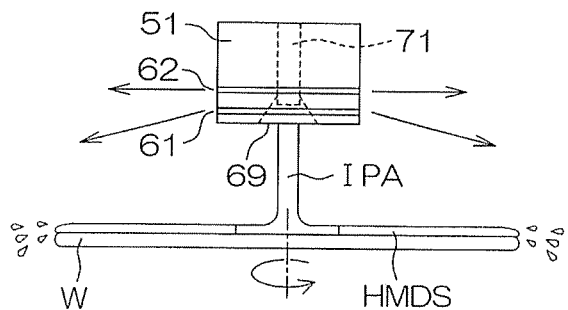
FIG. 5D is a schematic cross-sectional view illustrating a state of the substrate when a second alcohol supply step is performed.
Figure 6:
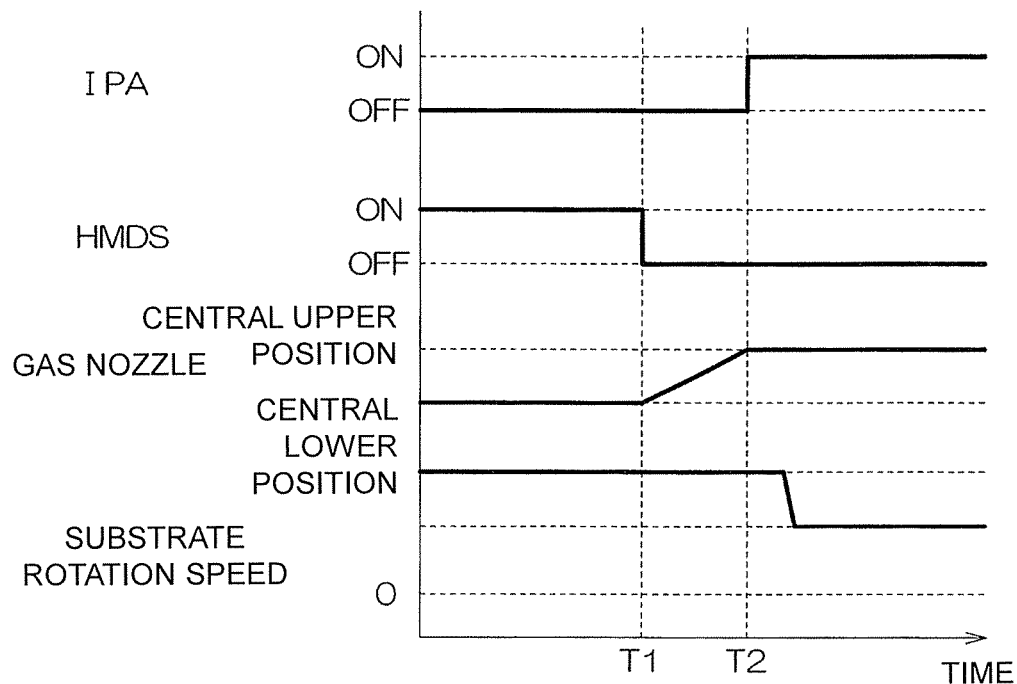
FIG. 6 is a time chart showing an operation of the substrate processing apparatus when an example of processing a substrate shown in FIG. 4 is performed.

FIG. 5A is a schematic cross-sectional view illustrating a state of the substrate W when a first alcohol supply step is performed. FIG. 5B is a schematic cross-sectional view illustrating a state of the substrate W when a hydrophobizing agent supply step is performed. FIG. 5C is a schematic cross-sectional view illustrating a state of the substrate W when a liquid amount decreasing step is performed. FIG. 5D is a schematic cross-sectional view illustrating a state of the substrate W when a second alcohol supply step is performed.

Hereinafter, reference is made to FIGS. 1 and 2. Reference is made to FIG. 4 to FIG. 6 as appropriate. The following operations are executed by the controller 3 controlling the substrate processing apparatus 1. In other words, the controller 3 is programmed to perform the following operations. The controller 3 is a computer including a memory 3m (see FIG. 1) which stores information such as programs and a processor 3p (see FIG. 1) which controls the substrate processing apparatus 1 according to the information stored in the memory 3m.

When the substrate W is processed by the substrate processing apparatus 1, a loading step of loading the substrate W into the chamber 4 is performed (step S1 in FIG. 4).

Specifically, all the scan nozzles including the first chemical liquid nozzle 28, the second chemical liquid nozzle 33, and the gas nozzle 51 are positioned at standby positions, and all the guards 23 are positioned at lower positions. In this state, a hand of a transfer robot enters the chamber 4 with the substrate W supported with the hand. Thereafter, the transfer robot places the substrate W on the hand on the spin chuck 8 with a front surface of the substrate W facing upward. After the substrate W is placed on the spin chuck 8, the transfer robot causes the hand to retreat from the inside of the chamber 4.

Next, a first chemical liquid supply step (step S2 in FIG. 4) of supplying DHF, which is an example of a chemical liquid, to the substrate W is performed.

Specifically, the guard lifting unit 27 raises at least one of the plurality of guards 23 so that an inner surface of any one of the guards 23 horizontally faces an outer circumferential surface of the substrate W. The first nozzle moving unit 32 moves the first nozzle arm 31 to position the discharge port of the first chemical liquid nozzle 28 above the substrate W. The spin motor 12 starts to rotate the substrate W in a state in which the substrate W is gripped by the chuck pins 9. In this state, the first chemical liquid valve 30 is opened, and the first chemical liquid nozzle 28 starts to discharge DHF.

The DHF discharged from the first chemical liquid nozzle 28 is applied on the central portion of the upper surface of the substrate W, and then flows outward along the upper surface of the rotating substrate W. Thereby, a liquid film of the DHF covering the entire upper surface region of the substrate W is formed on the substrate W. When a predetermined time has elapsed since the first chemical liquid valve 30 is opened, the first chemical liquid valve 30 is closed, and the discharge of the DHF from the first chemical liquid nozzle 28 is stopped. Thereafter, the first nozzle moving unit 32 causes the first chemical liquid nozzle 28 to retreat from above the substrate W.

Next, a first rinsing liquid supply step (step S3 in FIG. 4) of supplying pure water, which is an example of a rinsing liquid, to the substrate W is performed.

Specifically, the rinsing liquid valve 40 is opened and the rinsing liquid nozzle 38 starts to discharge pure water. The pure water discharged from the rinsing liquid nozzle 38 is applied on the central portion of the upper surface of the substrate W, and then flows outward along the upper surface of the rotating substrate W. Thereby, the DHF on the substrate W is replaced with the pure water, and a liquid film of the pure water covering the entire upper surface region of the substrate W is formed. Thereafter, the rinsing liquid valve 40 is closed, and the discharge of the pure water from the rinsing liquid nozzle 38 is stopped.

Next, a second chemical liquid supply step (step S4 in FIG. 4) of supplying SC1, which is an example of the chemical liquid, to the substrate W is performed.

Specifically, the second nozzle moving unit 37 moves the second nozzle arm 36 to position the discharge port of the second chemical liquid nozzle 33 above the substrate W. By vertically moving at least one of the plurality of guards 23, the guard lifting unit 27 switches the guard 23 facing the outer circumferential surface of the substrate W. After the discharge port of the second chemical liquid nozzle 33 is disposed above the substrate W, the second chemical liquid valve 35 is opened so that the second chemical liquid nozzle 33 starts to discharge the SC1.

The SC1 discharged from the second chemical liquid nozzle 33 is applied on the central portion of the upper surface of the substrate W, and then flows outward along the upper surface of the rotating substrate W. Thereby, the pure water on the substrate W is replaced with the SC1, and a liquid film of the SC1 covering the entire upper surface region of the substrate W is formed. When a predetermined time has elapsed since the second chemical liquid valve 35 is opened, the second chemical liquid valve 35 is closed so that the discharge of the SC1 from the second chemical liquid nozzle 33 is stopped. Thereafter, the second nozzle moving unit 37 causes the second chemical liquid nozzle 33 to retreat from above the substrate W.

Next, a second rinsing liquid supply step (step S5 in FIG. 4) of supplying pure water, which is an example of the rinsing liquid, to the substrate W is performed.

Specifically, the rinsing liquid valve 40 is opened and the rinsing liquid nozzle 38 starts to discharge the pure water. The pure water discharged from the rinsing liquid nozzle 38 is applied on the central portion of the upper surface of the substrate W, and then flows outward along the upper surface of the rotating substrate W. Thereby, the SC1 on the substrate W is replaced with the pure water, and a liquid film of the pure water covering the entire upper surface region of the substrate W is formed. Thereafter, the rinsing liquid valve 40 is closed so that the discharge of the pure water from the rinsing liquid nozzle 38 is stopped.

Next, the first alcohol supply step (step S6 in FIG. 4) of supplying IPA having a temperature higher than room temperature, which is an example of alcohol, to the substrate W is performed.

Specifically, the third nozzle moving unit 68 moves the gas nozzle 51 from the standby position to the central upper position. Thereby, the alcohol nozzle 71, the hydrophobizing agent nozzle 75, and the solvent nozzle 78 are disposed above the substrate W. Thereafter, the alcohol valve 73 is opened and the alcohol nozzle 71 starts to discharge the IPA.

On the other hand, the first gas valve 53 and the second gas valve 55 are opened, and the first gas discharge port 61 and the second gas discharge port 62 of the gas nozzle 51 start to discharge nitrogen gas (see FIG. 5A). Discharge of the nitrogen gas may be started before or after the gas nozzle 51 reaches the central upper position, or may be started when the gas nozzle 51 reaches the central upper position. Further, by vertically moving at least one of the plurality of guards 23 before or after the discharge of the IPA is started, the guard lifting unit 27 may switch the guards 23 facing the outer circumferential surface of the substrate W.

As illustrated in FIG. 5A, the IPA discharged from the alcohol nozzle 71 passes through the upper side central opening 69 of the gas nozzle 51 positioned at the central upper position and is applied on the central portion of the upper surface of the substrate W. The IPA applied on the upper surface of the substrate W flows outward along the upper surface of the rotating substrate W. Thereby, the pure water on the substrate W is replaced with the IPA, and a liquid film of the IPA covering the entire upper surface region of the substrate W is formed. Thereafter, the alcohol valve 73 is closed so that the discharge of the IPA from the alcohol nozzle 71 is stopped.

Next, the hydrophobizing agent supply step of supplying a hydrophobizing agent having a temperature higher than room temperature to the substrate W is performed (step S7 in FIG. 4).

Specifically, the third nozzle moving unit 68 lowers the gas nozzle 51 from the central upper position to the central lower position. Further, the hydrophobizing agent valve 77 is opened, and the hydrophobizing agent nozzle 75 starts to discharge the hydrophobizing agent. By vertically moving at least one of the plurality of guards 23 before or after the discharge of the hydrophobizing agent is started, the guard lifting unit 27 may switch the guard 23 facing the outer circumferential surface of the substrate W.

As illustrated in FIG. 5B, the hydrophobizing agent discharged from the hydrophobizing agent nozzle 75 passes through the upper side central opening 69 of the gas nozzle 51 positioned at the central lower position and is applied on the central portion of the upper surface of the substrate W. The hydrophobizing agent which is applied on the upper surface of the substrate W flows outward along the upper surface of the rotating substrate W. Thereby, the IPA on the substrate W is replaced with the hydrophobizing agent, and a liquid film of the hydrophobizing agent covering the entire upper surface region of the substrate W is formed. Thereafter, the hydrophobizing agent valve 77 is closed so that the discharge of the hydrophobizing agent from the hydrophobizing agent nozzle 75 is stopped.

After the IPA on the substrate W is replaced with the hydrophobizing agent, the second alcohol supply step of replacing the hydrophobizing agent on the substrate W with IPA is performed (step S9 in FIG. 4). Before that, a liquid amount decreasing step of decreasing a liquid amount of the hydrophobizing agent on the substrate W is performed (step S8 in FIG. 4). Specifically, at least one of a rotation speed of the substrate W and a discharge flow rate of the hydrophobizing agent is changed so that an amount per unit time of the hydrophobizing agent discharged from the substrate W by the rotation of the substrate W is more than an amount per unit time of the hydrophobizing agent discharged from the hydrophobizing agent nozzle 75 toward the substrate W.

As will be described below, in the second alcohol supply step performed after the liquid amount decreasing step, the third nozzle moving unit 68 raises the gas nozzle 51 from the lower central position to the upper central position. As illustrated in FIG. 6, in the liquid amount decreasing step in one example of this process, while the gas nozzle 51 is raised from the central lower position to the central upper position (a period from time T1 to time T2 illustrated in FIG. 6) and while maintaining a constant rotation speed of the hydrophobizing agent nozzle 75, the discharge of the hydrophobizing agent from the hydrophobizing agent nozzle 75 is stopped (HMDS OFF).

In the period from the time T1 to the time T2 illustrated in FIG. 6, the amount per unit time of the hydrophobizing agent discharged from the substrate W by the rotation of the substrate W is more than the amount per unit time of the hydrophobizing agent discharged toward the substrate W. As can be understood when FIG. 5B and FIG. 5C are compared, as a result, the amount of the hydrophobizing agent on the substrate W decreases while a state in which the entire upper surface region of the substrate W is covered with the liquid film of the hydrophobizing agent is maintained.

After the amount of the hydrophobizing agent on the substrate W has decreased, the second alcohol supply step of supplying IPA having a temperature higher than room temperature, which is an example of alcohol, to the substrate W is performed (step S9 in FIG. 4).

Specifically, as described above, the third nozzle moving unit 68 raises the gas nozzle 51 from the lower central position to the upper central position. Further, the alcohol valve 73 is opened so that the alcohol nozzle 71 starts to discharge IPA. By vertically moving at least one of the plurality of guards 23 before or after the discharge of IPA is started, the guard lifting unit 27 may switch the guards 23 facing the outer circumferential surface of the substrate W.

As illustrated in FIG. 5D, the IPA discharged from the alcohol nozzle 71 passes through the upper side central opening 69 of the gas nozzle 51 positioned at the central upper position and is applied on the central portion of the upper surface of the substrate W. The IPA applied on the upper surface of the substrate W flows outward along the upper surface of the rotating substrate W. Thereby, the hydrophobizing agent on the substrate W is replaced with the IPA, and a liquid film of IPA covering the entire upper surface region of the substrate W is formed. Thereafter, the alcohol valve 73 is closed so that the discharge of the IPA from the alcohol nozzle 71 is stopped.

Next, a solvent supply step of supplying HFO having a temperature higher than room temperature, which is an example of a fluorine-based organic solvent, to the substrate W is performed (step S10 in FIG. 4).

Specifically, in a state in which the gas nozzle 51 is positioned at the central upper position, the solvent valve 80 is opened so that the solvent nozzle 78 starts to discharge the HFO. By vertically moving at least one of the plurality of guards 23 before or after the discharge of the HFO is started, the guard lifting unit 27 may switch the guard 23 facing the outer circumferential surface of the substrate W.

The HFO discharged from the solvent nozzle 78 passes through the upper side central opening 69 of the gas nozzle 51 positioned at the central upper position and is applied on the central portion of the upper surface of the substrate W. The HFO applied on the upper surface of the substrate W flows outward along the upper surface of the rotating substrate W. Thereby, the IPA on the substrate W is replaced with the HFO, and a liquid film of the HFO covering the entire upper surface region of the substrate W is formed. Thereafter, the solvent valve 80 is closed so that the discharge of the HFO from the solvent nozzle 78 is stopped.

Next, a drying step of drying the substrate W by high-speed rotation of the substrate W is performed (step S11 of FIG. 4).

Specifically, the spin motor 12 raises the rotation speed of the substrate W after the discharge of the HFO from the solvent nozzle 78 is stopped. The liquid that has adhered to the substrate W scatters around the substrate W due to the high-speed rotation of the substrate W. As a result, the substrate W is dried in a state in which a space between the substrate W and the gas nozzle 51 is filled with nitrogen gas. When a predetermined time has elapsed since the high-speed rotation of the substrate W is started, the rotation of the spin motor 12 is stopped. Thereby, the rotation of the substrate W is stopped.

Next, an unloading step of unloading the substrate W from the chamber 4 is performed (step S12 in FIG. 4).

Specifically, the first gas valve 53 and the second gas valve 55 are closed, and the discharge of the nitrogen gas from the first gas discharge port 61 and the second gas discharge port 62 is stopped. Further, the third nozzle moving unit 68 moves the gas nozzle 51 to the standby position. The guard lifting unit 27 lowers all the guards 23 to the lower position. After the plurality of chuck pins 9 release the gripping of the substrate W, the transfer robot supports the substrate W on the spin chuck 8 with a hand. Thereafter, the transfer robot causes the hand to retreat from the inside of the chamber 4 while supporting the substrate W with the hand. As a result, the processed substrate W is unloaded from the chamber 4.

Figure 7:
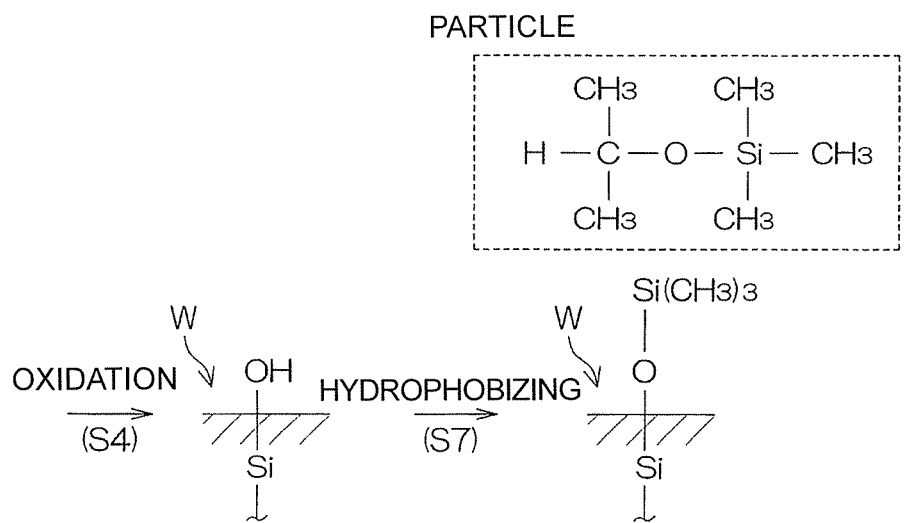
FIG. 7 is a schematic cross-sectional view for describing a change in chemical structure of a surface of the substrate when an example of processing a substrate shown in FIG. 4 is performed.
Figure 8A:
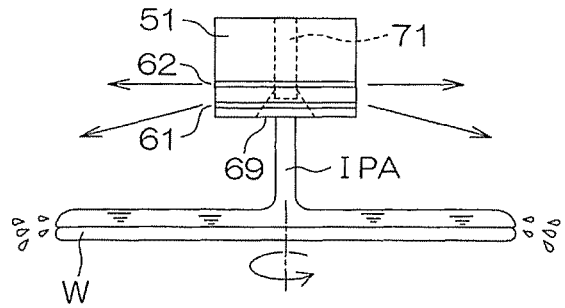
FIG. 8A is a schematic cross-sectional view illustrating a state of a substrate when the first alcohol supply step is performed.
Figure 8B:
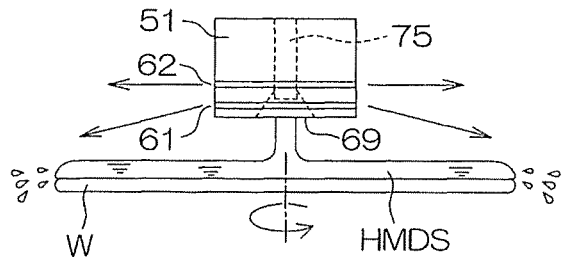
FIG. 8B is a schematic cross-sectional view illustrating a state of the substrate when the hydrophobizing agent supply step is performed.
Figure 8C:
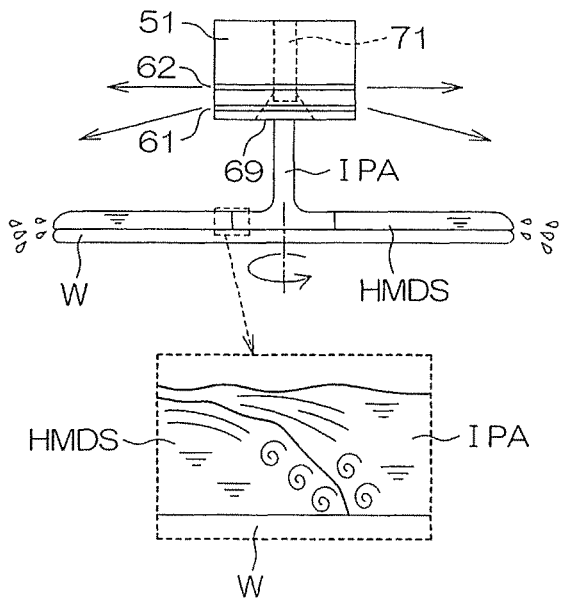
FIG. 8C is a schematic cross-sectional view illustrating a state of the substrate when the second alcohol supply step is performed.

FIG. 7 is a schematic cross-sectional view for describing a change in chemical structure of the surface of the substrate W when an example of processing of the substrate W shown in FIG. 4 is performed. FIGS. 8A to 8C are schematic cross-sectional views illustrating a state of the substrate W when the liquid amount decreasing step (step S8 in FIG. 4) is not performed in the example of the processing of the substrate W shown in FIG. 4.

FIG. 8A is a schematic cross-sectional view illustrating a state of the substrate W when the first alcohol supply step is performed. FIG. 8B is a schematic cross-sectional view illustrating a state of the substrate W when the hydrophobizing agent supply step is performed. FIG. 8C is a schematic cross-sectional view illustrating a state of the substrate W when the second alcohol supply step is performed.

In one example of the processing of the substrate W described above, SCl is supplied to the substrate W, and then a hydrophobizing agent is supplied to the substrate W. The SCl contains hydrogen peroxide water which is an example of an oxidizing agent that oxidizes the surface of the substrate W. As illustrated in FIG. 7, when the SCl is supplied to the substrate W, the surface of the substrate W is oxidized, and a hydroxy group which is a hydrophilic group is exposed on the surface of the substrate W. Thereby, the hydrophilicity of the surface of the substrate W increases. Thereafter, when the hydrophobizing agent is supplied to the substrate W, the hydrophobizing agent reacts with the hydroxy group on the surface of the substrate W, and the hydrogen atom of the hydroxy group is substituted with a silyl group containing a methyl group. As a result, the hydrophobicity of the surface of the substrate W increases.

On the other hand, in one example of the processing of the substrate W described above, the IPA is supplied to the substrate W before and after the hydrophobizing agent is supplied to the substrate W. In the hydrophobizing agent supply step (step S7 in FIG. 4), the hydrophobizing agent is miscible with the IPA on the substrate W. In the second alcohol supply step (step S9 in FIG. 4), the IPA is miscible with the hydrophobizing agent on the substrate W. When the IPA reacts with the hydrophobizing agent, a silyl compound containing a hydrophobic group such as a methyl group is generated in a mixed liquid of the IPA and the hydrophobizing agent. In FIG. 7, the silyl compound generated by the reaction between the IPA and the hydrophobizing agent is surrounded by a dashed-line box. This silyl compound can be particles.

In the hydrophobizing agent supply step (step S7 in FIG. 4), the hydrophobizing agent is discharged toward the surface of the substrate W covered with the liquid film of the IPA. After the hydrophobizing agent is applied on a liquid application position on the surface of the substrate W, the hydrophobizing agent flows radially from the liquid application position. The hydrophobizing agent positioned at the liquid application position and in the vicinity thereof is forced to flow outward due to the hydrophobizing agent. Thereby, the liquid film of the substantially circular hydrophobizing agent is formed in the central portion of the surface of the substrate W, and the liquid film of the IPA changes into an annular shape surrounding the liquid film of the hydrophobizing agent. When the discharge of the hydrophobizing agent is continued, an outer edge of the liquid film of the hydrophobizing agent spreads to an outer edge of the surface of the substrate W, and the IPA on the substrate W is quickly replaced with the hydrophobizing agent.

Immediately after the start of the supply of the hydrophobizing agent, since the hydrophobizing agent has not sufficiently reacted with the surface of the substrate W, the surface of the substrate W is hydrophilic. The particles (silyl compound) generated by the reaction between the IPA and the hydrophobizing agent contain a hydrophobic group such as a methyl group. Therefore, in an initial stage of the hydrophobizing agent supply step, the particles cannot easily adhere to the surface of the substrate W. Further, in the hydrophobizing agent supply step, since the IPA on the substrate W is replaced with the hydrophobizing agent relatively quickly, few particles are generated on the substrate W.

On the other hand, in the second alcohol supply step (step S9 in FIG. 4), IPA is discharged toward the surface of the substrate W covered with the liquid film of the hydrophobizing agent. After the IPA is applied on the application position on the surface of the substrate W, the IPA flows radially from the liquid application position. The hydrophobizing agent positioned at the liquid application position and in the vicinity thereof is forced to flow outward due to the IPA. As a result, the liquid film of the substantially circular IPA is formed in the central portion of the surface of the substrate W, and the liquid film of the hydrophobizing agent changes into an annular shape surrounding the liquid film of the IPA (see FIG. 8C).

The IPA applied on the surface of the substrate W flows radially from the liquid application position due to the applied momentum, that is, kinetic energy of the IPA. At the central portion of the surface of the substrate W, the hydrophobizing agent is replaced with the IPA relatively quickly. However, at a position somewhat spaced apart from the liquid application position of the IPA, the momentum of the IPA is weakened and a replacement rate of the hydrophobizing agent decreases. Further, when a density of the IPA is lower than a density of the hydrophobizing agent, as illustrated in a dashed-line box in FIG. 8C, since the IPA is not inside the hydrophobizing agent but tries to flow outward along a surface layer (a layer on a side opposite to the substrate W) of the hydrophobizing agent, the replacement rate of the hydrophobizing agent further decreases.

When a certain period of time has elapsed since a start of the discharge of the IPA, since a liquid amount of the hydrophobizing agent on the substrate W decreases, although the hydrophobizing agent is quickly discharged from the substrate W, since a relatively large amount of the hydrophobizing agent is on the substrate W in an initial stage of the second alcohol supply step, retention may occur at an interface between the IPA and the hydrophobizing agent as illustrated in the dashed-line box in FIG. 8C. Therefore, retention of the IPA and the hydrophobizing agent may occur in the central region of the surface of the substrate W or in the annular region in the vicinity thereof in some cases.

In the second alcohol supply step, the surface of the substrate W has changed to having hydrophobicity. Therefore, particles generated by the reaction between the IPA and the hydrophobizing agent tend to adhere to the surface of the substrate W. Further, when the IPA and the hydrophobizing agent remain at the interface between the IPA and the hydrophobizing agent, a force causing particles generated at the interface to flow outward is weakened, and thus the particles easily reach the surface of the substrate W. Therefore, the particles tend to adhere to a region in which the interface of the IPA and the hydrophobizing agent is formed, that is, the central portion of the surface of the substrate W or the annular region in the vicinity thereof.

In one example of the processing of the substrate W described above, before the hydrophobizing agent on the substrate W is replaced with the IPA, the liquid amount of the hydrophobizing agent on the substrate W is decreased (liquid amount decreasing step (step S8 in FIG. 4)). Therefore, when the IPA is supplied to the substrate W, the liquid amount of the hydrophobizing agent that reacts with the IPA on the substrate W decreases, and the number of particles generated by the reaction between the IPA and the hydrophobizing agent decreases. As a result, the number of particles adhering to the surface of the substrate W can be decreased, and the number of particles remaining on the substrate W after drying can be decreased.

Further, since a thickness of the liquid film of the hydrophobizing agent is decreased, the hydrophobizing agent on the substrate W can be discharged relatively quickly, and the occurrence of retention can be suppressed or prevented. Therefore, even when particles are generated by the reaction between the IPA and the hydrophobizing agent, the particles are easily discharged from the substrate W before the particles reach the surface of the substrate W. As a result, the number of particles adhering to the surface of the substrate W can be further decreased, and the cleanliness of the substrate W after drying can be further enhanced.

Figure 9:
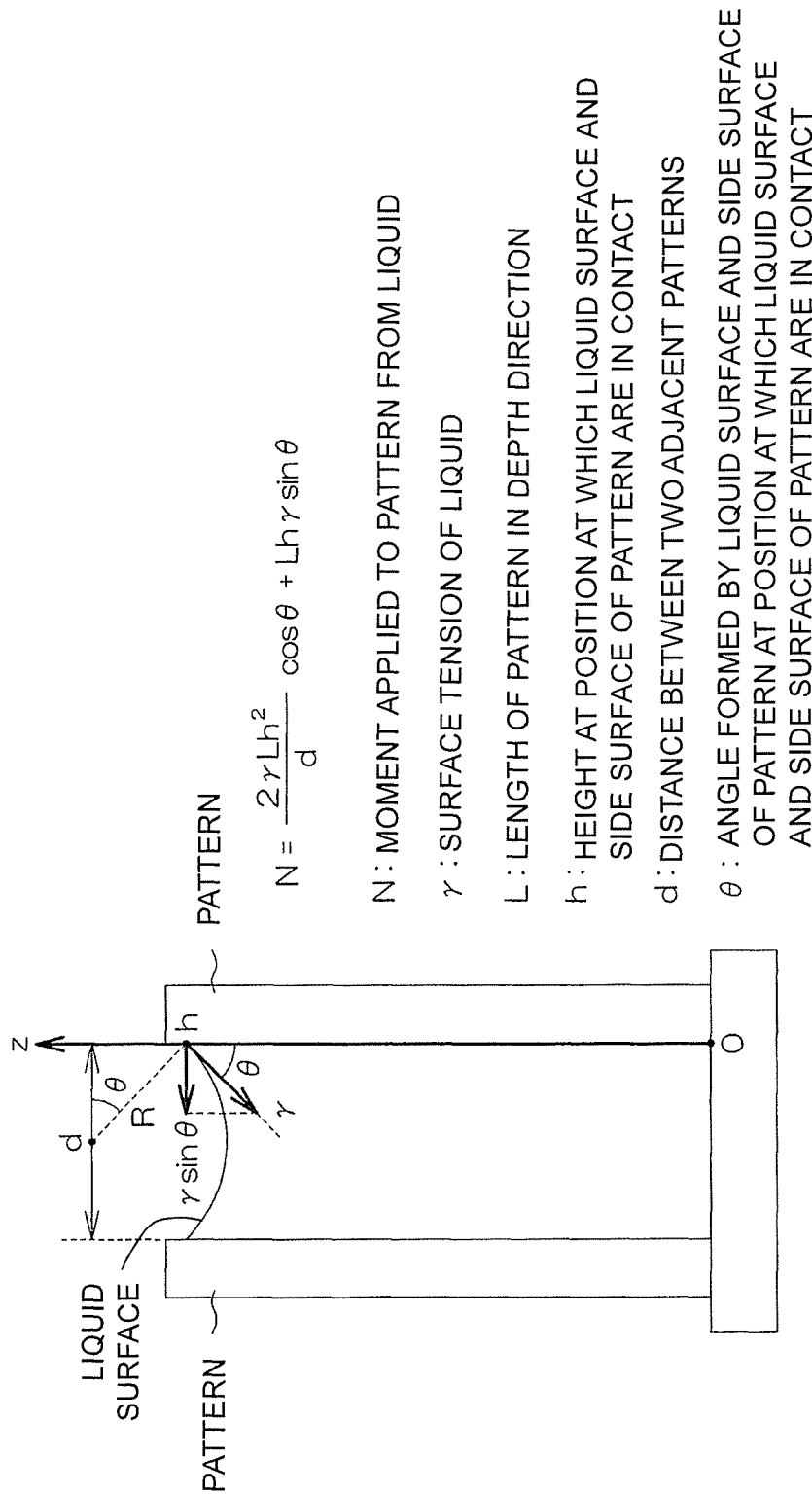
FIG. 9 is a view for describing a force applied to a pattern during drying of the substrate.

FIG. 9 is a view for describing a force applied to a pattern during drying of the substrate W.

As illustrated in FIG. 9, when the substrate W is dried, a liquid amount on the substrate W gradually decreases, and a liquid surface moves between two adjacent patterns. When there is such a liquid surface between two adjacent patterns, a moment that collapses the patterns is applied to the patterns at a position at which the liquid surface and a side surface of the patterns are in contact.

The equation shown in FIG. 9 expresses a moment (N) applied to the pattern from the liquid. Symbols represented by $\gamma$, L, h, d, and $\theta$ in the equation are as described in FIG. 9. A first term $((2\gamma Lh^2 \cos\theta)/d)$ on the right hand side in FIG. 9 represents a moment originating from the Laplace pressure applied to the pattern from the liquid. A second term $(Lh\gamma \sin\theta)$ on the right hand side in FIG. 9 represents a moment originating from a surface tension of the liquid.

When a contact angle $\theta$ of a liquid with respect to a side surface of the pattern is set to 90 degrees, $\cos\theta$ becomes zero, and the first term on the right hand side in FIG. 9 becomes zero. A purpose of supplying the hydrophobizing agent to the substrate W is to bring the contact angle $\theta$ closer to 90 degrees. In practice, however, the contact angle $\theta$ cannot be easily increased to 90 degrees. In addition, when a material of the pattern changes, the contact angle $\theta$ also changes. For example, as compared with silicon (Si), the contact angle $\theta$ of silicon nitride (SiN) cannot be easily increased.

Even when the contact angle $\theta$ can be 90 degrees, since $\sin\theta$ is included in the second term on the right hand side in FIG. 9, the moment applied to the pattern from the liquid does not become zero. Therefore, when collapse of a finer pattern is to be prevented, a surface tension $\gamma$ of the liquid needs to be further lowered. This is because not only the first term on the right hand side but the second term on the right hand side also is lowered.

In one example of the processing of the substrate W described above, after the hydrophobizing agent on the substrate W is replaced with the IPA, HFO is supplied to the substrate W and the substrate W on which the HFO has adhered is dried. IPA is alcohol having a lower surface tension than water, and HFO is a fluorine-based organic solvent having a lower surface tension than the IPA. Since the substrate W on which such a liquid with extremely low surface tension has adhered is dried, a force applied to the pattern during the drying of the substrate W can be decreased. Thereby, even when it is a finer pattern, a collapse rate of the pattern can be decreased.

In addition, when the hydrophobizing agent is supplied to the substrate W, a surface free energy of the pattern is lowered. During the drying of the substrate W, there are cases in which the pattern is elastically deformed due to the moment applied from the liquid to the pattern and distal end portions of two adjacent patterns stick together. In a fine pattern, since a restoring force of the patterns is small, the distal end portions of the patterns remain stuck to each other even after the substrate W is dried. Even in such a case, if the surface free energy of the patterns is small, the distal end portions of the patterns are easily separated from each other. Therefore, by supplying the hydrophobizing agent to the substrate W, the number of defects of the pattern can be decreased.

In the present embodiment as described above, the liquid film of the hydrophobizing agent covering an entire surface region of the substrate W on which patterns are formed is formed. Thereafter, while maintaining this state, the liquid amount of the hydrophobizing agent on the substrate W is decreased. Also, in a state in which the liquid amount of the hydrophobizing agent on the substrate W has decreased, IPA is supplied to the surface of the substrate W covered with the liquid film of the hydrophobizing agent, and the hydrophobizing agent on the substrate W is replaced with the IPA which is an example of alcohol. Since IPA has both a hydrophilic group and a hydrophobic group, the hydrophobizing agent on the substrate W is replaced with the IPA. Thereafter, the substrate W is dried.

Since the hydrophobizing agent is supplied to the substrate W before drying the substrate W, a force applied to the pattern during the drying of the substrate W can be decreased. Thereby, the collapse rate of the pattern can be decreased. Further, since the liquid amount of the hydrophobizing agent on the substrate W is decreased before supplying IPA to the substrate W, the number of particles generated by a reaction between the IPA and the hydrophobizing agent can be decreased. Thereby, the number of particles remaining on the substrate W after drying can be decreased, and cleanliness of the substrate W after drying can be enhanced.

In the present embodiment, the IPA preheated to a temperature higher than room temperature, that is, heated to a temperature higher than room temperature before being supplied to the substrate W is supplied to the surface of the substrate W. As a result, since the efficiency of replacing the hydrophobizing agent with IPA increases, the amount of hydrophobizing agent remaining on the substrate W after drying can be decreased to zero or substantially to zero. Therefore, cleanliness of the substrate W after drying can be further enhanced.

In the present embodiment, after the hydrophobizing agent on the substrate W is replaced with the IPA, HFO which is an example of a fluorine-based organic solvent is supplied to the substrate W, and the substrate W on which the HFO has adhered is dried. The surface tension of HFO is lower than the surface tension of water and is lower than the surface tension of IPA. Therefore, a force applied to the pattern from the liquid during the drying of the substrate W can be further decreased, and the collapse rate of the pattern can be further decreased.

In addition, even when a very small amount of the IPA remains on the substrate W when the IPA on the substrate W is replaced with the HFO, since the surface tension of the IPA is lower than the surface tension of water, a force applied to the pattern from the liquid during the drying of the substrate W is lower than in a case in which a liquid having a higher surface tension such as water remains. Therefore, even when a very small amount of the IPA remains, the collapse rate of the pattern can be decreased.

In the present embodiment, the HFO preheated to a temperature higher than room temperature, that is, heated to a temperature higher than room temperature before being supplied to the substrate W is supplied to the surface of the substrate W. The surface tension of the HFO decreases in accordance with a liquid temperature increase. Therefore, by supplying the high-temperature HFO to the substrate W, a force applied to the pattern from the liquid during the drying of the substrate W can be further decreased. As a result, the collapse rate of the pattern can be further decreased.

In the present embodiment, high-temperature IPA is supplied to the surface of the substrate W, and then HFO is supplied to the surface of the substrate W. A liquid temperature of the IPA before being supplied to the substrate W is higher than a liquid temperature of the HFO before being supplied to the substrate W. Thereby, a temperature decrease of the HFO on the substrate W can be suppressed or prevented. The liquid temperature of the HFO on the substrate W can be increased in some cases. As a result, since the surface tension of the HFO can be further decreased, a force applied to the pattern from the liquid during the drying of the substrate W can be further decreased.

Another Embodiment

The disclosure is not limited to the contents of the above-described embodiments, and various modifications can be made.

For example, the rinsing liquid nozzle 38 may be a scan nozzle that can move the liquid application position of the processing liquid with respect to the substrate W, instead of a fixed nozzle fixed to the partition wall 5 of the chamber 4.

When supplying the IPA at room temperature to the substrate W, the first heater 74 may be omitted. Similarly, when supplying the HFO at room temperature to the substrate W, the second heater 81 may be omitted.

The IPA at room temperature may be supplied to the substrate W only in one of the first alcohol supply step (step S6 in FIG. 4) and the second alcohol supply step (step S9 in FIG. 4). In this case, two pipes for guiding the WA supplied to the substrate W may be provided, and a heater may be incorporated only into one of the two pipes.

At least one of the alcohol nozzle 71, the hydrophobizing agent nozzle 75, and the solvent nozzle 78 may not be held by the gas nozzle 51. In this case, a fourth nozzle arm holding at least one of the alcohol nozzle 71, the hydrophobizing agent nozzle 75, and the solvent nozzle 78, and a fourth nozzle moving unit for moving at least one of the alcohol nozzle 71, the hydrophobizing agent nozzle 75, and the solvent nozzle 78 by moving the fourth nozzle arm may be provided in the processing unit 2.

The gas nozzle 51 may be omitted. Alternatively, instead of the gas nozzle 51, a blocking member in which a circular lower surface having an outer diameter equal to or larger than the diameter of the substrate W is provided may be disposed above the spin chuck 8. In this case, since the blocking member overlaps an entire upper surface region of the substrate W in a plan view, the entire upper surface region of the substrate W can be protected by the blocking member without forming the annular airflow that flows radially.

In one example of the processing of the substrate W described above, after the first alcohol supply step (step S6 in FIG. 4) is performed and before the hydrophobizing agent supply step (step S7 in FIG. 4) is performed, the liquid amount decreasing step of decreasing the liquid amount of the IPA on the substrate W may be further performed.

In one example of the processing of the substrate W, the second alcohol supply step (step S9 in FIG. 4) may be performed without performing the liquid amount decreasing step (step S8 in FIG. 4).

In one example of the processing of the substrate W described above, after the solvent supply step (step S10 in FIG. 4) is performed and before the second alcohol supply step (step S9 in FIG. 4) is performed, the IPA on the substrate W may be replaced with a mixed liquid of alcohol such as IPA and a fluorine-based organic solvent such as HFO. Alternatively, in the solvent supply step (step S10 of FIG. 4), a mixed liquid of alcohol such as IPA and a fluorine-based organic solvent such as HFO may be supplied to the substrate W.

In one example of the processing of the substrate W described above, the drying step (step S11 in FIG. 4) may be performed without performing the solvent supply step (step S10 in FIG. 4).

The alcohol supplied to the substrate W in the second alcohol supply step (step S9 in FIG. 4) may be different from the alcohol supplied to the substrate W in the first alcohol supply step (step S6 in FIG. 4).

In parallel with the first alcohol supply step (step S6 of FIG. 4), a heated fluid supply step of supplying a heated fluid at a temperature higher than room temperature to the lower surface of the substrate W may be performed. Specifically, the lower side rinsing liquid valve 43 may be opened to discharge warm water (high-temperature pure water) to the lower surface nozzle 41.

As illustrated in FIG. 2, the processing unit 2 may include an indoor heater 82 for heating a liquid on the substrate W. The indoor heater 82 is disposed in the chamber 4. The indoor heater 82 is disposed above or below the substrate W held by the spin chuck 8.

The indoor heater 82 may be an electric heater whose temperature is raised to a temperature higher than room temperature by converting electric power into Joule heat, or may be a lamp that increases a temperature of the substrate to a temperature higher than room temperature by radiating light toward the upper surface or the lower surface of the substrate W. The indoor heater 82 may heat the entire substrate W at the same time or may heat a portion of the substrate W. In the latter case, the indoor heater 82 may be moved by a heater moving unit.

When the indoor heater 82 is provided in the processing unit 2, in one example of the processing of the substrate W described above, a liquid on the substrate W may be heated by the indoor heater 82 to a temperature higher than room temperature. For example, when the hydrophobizing agent on the substrate W is replaced with IPA, if the liquid on the substrate W (liquid containing at least one of the hydrophobizing agent and the IPA) is heated, the efficiency of replacing the hydrophobizing agent with IPA can be increased. When the HFO on the substrate W is heated, the surface tension of the HFO can be further decreased.

The substrate processing apparatus 1 is not limited to an apparatus for processing a disc-shaped substrate W, and may be an apparatus for processing a polygonal substrate W.

Two or more of all the configurations described above may be combined. Two or more of all the steps described above may be combined.

The spin chuck 8 is an example of the substrate holding unit. The spin motor 12 is an example of the liquid amount decreasing unit and the drying unit. The alcohol nozzle 71 is an example of the first organic solvent supply unit. The alcohol pipe 72 is an example of the first organic solvent supply unit. The alcohol valve 73 is an example of the first organic solvent supply unit. The hydrophobizing agent nozzle 75 is an example of the hydrophobizing agent supply unit. The hydrophobizing agent pipe 76 is an example of the hydrophobizing agent supply unit. The hydrophobizing agent valve 77 is an example of the hydrophobizing agent supply unit and the liquid amount decreasing unit. The solvent nozzle 78 is an example of the second organic solvent supply unit. The solvent pipe 79 is an example of the second organic solvent supply unit. The solvent valve 80 is an example of the second organic solvent supply unit.

This application corresponds to Japanese Patent Application No. 2017-181323 filed with the Japan Patent Office on Sep. 21, 2017, the entire disclosure of which is incorporated herein by reference.

One embodiment of the disclosure provides a method of processing a substrate including a hydrophobizing agent supply step of forming a liquid film of a hydrophobizing agent that covers an entire surface region of a substrate by supplying a liquid which is the hydrophobizing agent for hydrophobizing a surface of the substrate with a pattern formed thereon to the surface of the substrate, a liquid amount decreasing step of decreasing a liquid amount of the hydrophobizing agent on the substrate while maintaining a state in which the entire surface region of the substrate is covered with the liquid film of the hydrophobizing agent after the hydrophobizing agent supply step, a first organic solvent supply step of supplying a liquid which is a first organic solvent to the surface of the substrate covered with the liquid film of the hydrophobizing agent in a state in which the liquid amount of the hydrophobizing agent on the substrate has decreased after the liquid amount decreasing step so that the liquid of the hydrophobizing agent on the substrate is replaced with the liquid which is the first organic solvent, and a drying step of drying the substrate after the first organic solvent supply step.

According to this method, a liquid film of the hydrophobizing agent that covers the entire surface region of the substrate having a pattern formed thereon is formed. Thereafter, while maintaining this state, the liquid amount of the hydrophobizing agent on the substrate is decreased. Then, in a state in which the liquid amount of the hydrophobizing agent on the substrate has decreased, the first organic solvent is supplied to the surface of the substrate covered with the liquid film of the hydrophobizing agent, and the hydrophobizing agent on the substrate is replaced with the first organic solvent. Since the first organic solvent has both a hydrophilic group and a hydrophobic group, the hydrophobizing agent on the substrate is replaced with the first organic solvent. Thereafter, the substrate is dried.

Since the hydrophobizing agent is supplied to the substrate before the substrate is dried, a force applied to the pattern from the liquid during drying of the substrate can be decreased. Thereby, a collapse rate of the pattern can be decreased. Further, since the liquid amount of the hydrophobizing agent on the substrate is decreased before supplying the first organic solvent to the substrate, the number of particles generated by a reaction between the first organic solvent and the hydrophobizing agent can be decreased. As a result, the number of particles remaining on the substrate W after drying can be decreased, and cleanliness of the substrate W after drying can be enhanced.

In the aforementioned embodiment, at least one of the following features may be added to the above.

The first organic solvent supply step may include supplying the liquid of the first organic solvent having a lower surface tension than water, which has been preheated to a temperature higher than room temperature, to the surface of the substrate covered with the liquid film of the hydrophobizing agent in a state in which the liquid amount of the hydrophobizing agent on the substrate has decreased after the liquid amount decreasing step so that the liquid of the hydrophobizing agent on the substrate is replaced with the liquid of the first organic solvent.

According to this method, the first organic solvent that has been preheated to a temperature higher than room temperature, that is, has been heated to a temperature higher than room temperature before being supplied to the substrate is supplied to the surface of the substrate. Thereby, since the efficiency of replacing the hydrophobizing agent with the first organic solvent increases, an amount of the hydrophobizing agent remaining on the substrate after drying can be decreased to zero or substantially to zero. Therefore, cleanliness of the substrate after drying can be further enhanced.

The first organic solvent supply step may include supplying the liquid of the first organic solvent having a lower surface tension than water to the surface of the substrate covered with the liquid film of the hydrophobizing agent in a state in which the liquid amount of the hydrophobizing agent on the substrate has decreased after the liquid amount decreasing step so that the liquid of the hydrophobizing agent on the substrate is replaced with the liquid of the first organic solvent, the method of processing a substrate may further include a second organic solvent supply step of supplying a liquid which is a second organic solvent having a lower surface tension than the first organic solvent to the surface of the substrate covered with the liquid film of the first organic solvent after the first organic solvent supply step so that the liquid of the first organic solvent on the substrate is replaced with the liquid of the second organic solvent, and the drying step may include drying the substrate on which the liquid of the second organic solvent has adhered after the second organic solvent supply step.

According to this method, after the hydrophobizing agent on the substrate is replaced with the first organic solvent, the second organic solvent is supplied to the substrate and the substrate on which the second organic solvent is adhered is dried. The surface tension of the second organic solvent is lower than the surface tension of water and is also lower than the surface tension of the first organic solvent. Therefore, a force applied to the pattern from the liquid during the drying of the substrate can be further decreased, and the collapse rate of the pattern can be further decreased.

In addition, even when a very small amount of the first organic solvent remains on the substrate when the first organic solvent on the substrate is replaced with the second organic solvent, since the surface tension of the first organic solvent is lower than the surface tension of water, a force applied to the pattern from the liquid during the drying of the substrate is lower than in a case in which a liquid having a higher surface tension such as water remains. Therefore, even when a very small amount of the first organic solvent remains, the collapse rate of the pattern can be decreased.

The second organic solvent supply step may include supplying the liquid of the second organic solvent having a lower surface tension than the first organic solvent, which has been preheated to a temperature higher than room temperature, to the surface of the substrate covered with the liquid film of the first organic solvent after the first organic solvent supply step so that the liquid of the first organic solvent on the substrate is replaced with the liquid of the second organic solvent.

According to this method, the second organic solvent preheated to a temperature higher than room temperature, that is, heated to a temperature higher than room temperature before being supplied to the substrate is supplied to the surface of the substrate. The surface tension of the second organic solvent decreases in accordance with a temperature increase. Therefore, by supplying the high-temperature second organic solvent to the substrate, a force applied to the pattern from the liquid during the drying of the substrate can be further decreased. As a result, the collapse rate of the pattern can be further decreased.

When the second organic solvent supplied to the substrate is preheated to a temperature higher than room temperature, the first organic solvent supplied to the substrate in the first organic solvent supply step may be preheated to a temperature higher than room temperature or may be at room temperature.

The first organic solvent supply step may include supplying the liquid of the first organic solvent having a lower surface tension than the water, which has been preheated to a temperature higher than a liquid temperature of the second organic solvent before being supplied to the substrate in the second organic solvent supply step, to the surface of the substrate covered with the liquid film of the hydrophobizing agent in a state in which the liquid amount of the hydrophobizing agent on the substrate has decreased after the liquid amount decreasing step so that the liquid of the hydrophobizing agent on the substrate is replaced with the liquid of the first organic solvent.

According to this method, the high-temperature first organic solvent is supplied to the surface of the substrate, and then the second organic solvent is supplied to the surface of the substrate. A liquid temperature of the first organic solvent before being supplied to the substrate is higher than the liquid temperature of the second organic solvent before being supplied to the substrate. Thereby, a temperature decrease of the second organic solvent on the substrate can be suppressed or prevented. The liquid temperature of the second organic solvent on the substrate can be increased in some cases. As a result, since the surface tension of the second organic solvent can be further decreased, a force applied to the pattern from the liquid during the drying of the substrate can be further decreased.

When the liquid temperature of the first organic solvent before being supplied to the substrate is higher than the liquid temperature of the second organic solvent before being supplied to the substrate, the second organic solvent supplied to the substrate in the second organic solvent supply step may be preheated to a temperature higher than room temperature or may be at room temperature.

The method of processing a substrate may further include a solvent heating step of heating the second organic solvent on the substrate with an indoor heater disposed above or below the substrate.

According to this configuration, the second organic solvent on the substrate is heated by the indoor heater disposed above or below the substrate. Thereby, the surface tension of the second organic solvent can be further decreased, and a force applied to the pattern from the liquid during the drying of the substrate can be further decreased.

The indoor heater is disposed in the chamber accommodating the substrate. The indoor heater may be an electric heater whose temperature rises to a temperature higher than room temperature by converting electric power into Joule heat, or may be a lamp that increases a temperature of the substrate to a temperature higher than room temperature by radiating light toward an upper surface or a lower surface of the substrate. The indoor heater may heat the entire substrate at the same time or may heat a portion of the substrate. In the latter case, the indoor heater may be moved by a heater moving unit.

The second organic solvent may be a fluorine-based organic solvent.

The first organic solvent may be an alcohol.

Another embodiment of the disclosure provides a substrate processing apparatus including a substrate holding unit configured to horizontally hold a substrate with a pattern formed on a surface thereof, a hydrophobizing agent supply unit configured to supply a liquid of a hydrophobizing agent for hydrophobizing the surface of the substrate to the surface of the substrate held by the substrate holding unit, a liquid amount decreasing unit configured to decrease a liquid amount of the hydrophobizing agent on the substrate held by the substrate holding unit, a first organic solvent supply unit configured to supply a liquid of a first organic solvent to the substrate held by the substrate holding unit, a drying unit configured to dry the substrate held by the substrate holding unit, and a controller configured to control the hydrophobizing agent supply unit, the liquid amount decreasing unit, the first organic solvent supply unit, and the drying unit.

The controller executes a hydrophobizing agent supply step of supplying the liquid of the hydrophobizing agent for hydrophobizing the surface of the substrate to the surface of the substrate so that a liquid film of the hydrophobizing agent that covers the entire surface region of the substrate is formed, a liquid amount decreasing step of decreasing the liquid amount of the hydrophobizing agent on the surface while maintaining a state in which an entire surface region of the substrate is covered with the liquid film of the hydrophobizing agent after the hydrophobizing agent supply step, a first organic solvent supply step of supplying a liquid of a first organic solvent to the surface of the substrate covered with the liquid film of the hydrophobizing agent in a state in which the liquid amount of the hydrophobizing agent on the substrate has decreased after the liquid amount decreasing step so that the liquid of the hydrophobizing agent on the substrate is replaced with the liquid of the first organic solvent, and a drying step of drying the substrate after the first organic solvent supply step. According to this configuration, the same effects as the above-described effects can be achieved.

In the aforementioned embodiment, at least one of the following features may be added to the substrate processing apparatus.

The substrate processing apparatus may further include a first heater configured to heat the liquid of the first organic solvent supplied to the substrate held by the substrate holding unit, wherein the first organic solvent supply step includes supplying the liquid of the first organic solvent having a lower surface tension than water, which has been preheated to a temperature higher than room temperature, to the surface of the substrate covered with the liquid film of the hydrophobizing agent in a state in which the liquid amount of the hydrophobizing agent on the substrate has decreased after the liquid amount decreasing step so that the liquid of the hydrophobizing agent on the substrate is replaced with the liquid of the first organic solvent. According to this configuration, the same effects as the above-described effects can be achieved.

The first organic solvent supply unit may supply the liquid of the first organic solvent having a lower surface tension than water to the substrate held by the substrate holding unit, the substrate processing apparatus may further include a second organic solvent supply unit configured to supply a liquid of a second organic solvent having a lower surface tension than the first organic solvent to the substrate held by the substrate holding unit, the first organic solvent supply step may include supplying the liquid of the first organic solvent which has a lower surface tension than water to the surface of the substrate covered with the liquid film of the hydrophobizing agent in a state in which the liquid amount of the hydrophobizing agent on the substrate has decreased after the liquid amount decreasing step so that the liquid of the hydrophobizing agent on the substrate is replaced with the liquid of the first organic solvent, the controller may further execute a second organic solvent supply step of supplying the liquid of the second organic solvent having a lower surface tension than the first organic solvent to the surface of the substrate covered with a liquid film of the first organic solvent after the first organic solvent supply step so that the liquid of the first organic solvent on the substrate is replaced with the liquid of the second organic solvent, and the drying step may include drying the substrate on which the liquid of the second organic solvent has adhered after the second organic solvent supply step. According to this configuration, the same effects as the above-described effects can be achieved.

The substrate processing apparatus may further include a second heater configured to heat the liquid of the second organic solvent supplied to the substrate held by the substrate holding unit, wherein the second organic solvent supply step includes supplying the liquid of the second organic solvent having a lower surface tension than the first organic solvent, which has been preheated to a temperature higher than room temperature, to the surface of the substrate covered with the liquid film of the first organic solvent after the first organic solvent supply step so that the liquid of the first organic solvent on the substrate is replaced with the liquid of the second organic solvent. According to this configuration, the same effects as the above-described effects can be achieved.

The substrate processing apparatus may further include a first heater configured to heat the liquid of the first organic solvent supplied to the substrate held by the substrate holding unit, wherein the first organic solvent supply step includes supplying the liquid of the first organic solvent having a lower surface tension than the water, which has been preheated to a temperature higher than a liquid temperature of the second organic solvent before being supplied to the substrate in the second organic solvent supply step, to the surface of the substrate covered with the liquid film of the hydrophobizing agent in a state in which the liquid amount of the hydrophobizing agent on the substrate has decreased after the liquid amount decreasing step so that the liquid of the hydrophobizing agent on the substrate is replaced with the liquid of the first organic solvent. According to this configuration, the same effects as the above-described effects can be achieved.

The substrate processing apparatus may further include an indoor heater disposed above or below the substrate held by the substrate holding unit, wherein the controller further executes a solvent heating step of heating the second organic solvent on the substrate with the indoor heater. According to this configuration, the same effects as the above-described effects can be achieved.

The second organic solvent may be a fluorine-based organic solvent.

The first organic solvent may be an alcohol.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of processing a substrate comprising:
    a hydrophobic agent supply step of forming a liquid film of a hydrophobic agent that covers an entire surface region of a substrate by causing a nozzle to discharge a liquid of the hydrophobic agent for hydrophobizing a surface of the substrate with a pattern formed thereon toward the surface of the substrate;
    a liquid amount decreasing step of decreasing a liquid amount of the hydrophobic agent on the substrate and raising the nozzle vertically from a first position above a central region of the substrate to an upwardly second position above the central region of the substrate after the hydrophobic agent supply step while maintaining a state in which the entire surface region of the substrate is covered with the liquid film of the hydrophobic agent by changing at least one of a rotation speed of the substrate and a discharge flow rate of the hydrophobic agent so that an amount per unit time of the hydrophobic agent discharged from the substrate by rotation of the substrate exceeds the amount per unit time of the hydrophobic agent discharged toward the substrate after the hydrophobic agent supply step;
    a first organic solvent supply step of supplying a liquid of a first organic solvent including isopropyl alcohol (IPA) to the surface of the substrate covered with the liquid film of the hydrophobic agent in a state in which the liquid amount of the hydrophobic agent on the substrate has decreased after the liquid amount decreasing step so that the liquid of the hydrophobic agent on the substrate is replaced with the liquid of the first organic solvent, wherein IPA is supplied to the surface of the substrate when the nozzle is in the upwardly second position; and
    a drying step of drying the substrate after the first organic solvent supply step,
    wherein a number of particles remaining on the dried substrate and generated by a reaction between the hydrophobic agent and the first organic solvent including IPA during the first organic solvent supply step is decreased due to the decrease of the liquid amount of the hydrophobic agent on the substrate in the liquid amount decreasing step.

2. The method of processing a substrate according to claim 1, wherein the first organic solvent supply step comprises supplying the liquid of the first organic solvent having a lower surface tension than water, which has been preheated to a temperature higher than room temperature, to the surface of the substrate covered with the liquid film of the hydrophobic agent in a state in which the liquid amount of the hydrophobic agent on the substrate has decreased after the liquid amount decreasing step so that the liquid of the hydrophobic agent on the substrate is replaced with the liquid of the first organic solvent.

3. The method of processing a substrate according to claim 1, wherein:
the first organic solvent supply step comprises supplying the liquid of the first organic solvent having a lower surface tension than water to the surface of the substrate covered with the liquid film of the hydrophobic agent in a state in which the liquid amount of the hydrophobic agent on the substrate has decreased after the liquid amount decreasing step so that the liquid of the hydrophobic agent on the substrate is replaced with the liquid of the first organic solvent;
the method of processing a substrate further comprises a second organic solvent supply step of supplying a liquid of a second organic solvent having a lower surface tension than the first organic solvent to the surface of the substrate covered with the liquid film of the first organic solvent after the first organic solvent supply step so that the liquid of the first organic solvent on the substrate is replaced with the liquid of the second organic solvent; and
the drying step comprises drying the substrate on which the liquid of the second organic solvent has adhered after the second organic solvent supply step.

4. The method of processing a substrate according to claim 1, wherein the liquid amount decreasing step comprises rotating the substrate while stopping discharging the hydrophobic agent toward the substrate.

5. The method of processing a substrate according to claim 1, wherein
the method further comprises: a chemical liquid supply step of increasing hydrophobicity of the surface of the substrate by supplying the substrate with a chemical liquid containing an oxidizing agent; and an organic solvent supply step of replacing the chemical liquid on the substrate with a liquid of an organic solvent by supplying the substrate with the liquid of the organic solvent before the hydrophobic agent supply step.

6. The method of processing a substrate according to claim 3, wherein the second organic solvent supply step comprises supplying the liquid of the second organic solvent having the lower surface tension than the first organic solvent, which has been preheated to a temperature higher than room temperature, to the surface of the substrate covered with the liquid film of the first organic solvent after the first organic solvent supply step so that the liquid of the first organic solvent on the substrate is replaced with the liquid of the second organic solvent.

7. The method of processing a substrate according to claim 3, wherein the first organic solvent supply step comprises supplying the liquid of the first organic solvent having the lower surface tension than the water and having a temperature higher than that of the second organic solvent used in the second organic solvent supply step to the surface of the substrate covered with the liquid film of the hydrophobic agent in a state in which the liquid amount of the hydrophobic agent on the substrate has decreased after the liquid amount decreasing step so that the liquid of the hydrophobic agent on the substrate is replaced with the liquid of the first organic solvent.

8. The method of processing a substrate according to claim 3, further comprising:
a solvent heating step of heating the second organic solvent on the substrate with an indoor heater disposed above or below the substrate.

9. The method of processing a substrate according to claim 3, wherein the second organic solvent is a fluorine-based organic solvent.

* * * * *